US012694190B2

(12) United States Patent
Huang et al.

(10) Patent No.: US 12,694,190 B2
(45) Date of Patent: Jul. 28, 2026

(54) LAYOUT METHOD AND SEMICONDUCTOR STRUCTURE FOR IC

(71) Applicant: TAIWAN SEMICONDUCTOR MANUFACTURING COMPANY LTD., Hsinchu (TW)

(72) Inventors: Ching-Yu Huang, Hsinchu City (TW); Wei-Cheng Lin, Taichung City (TW); Jiann-Tyng Tzeng, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 387 days.

(21) Appl. No.: 18/403,683

(22) Filed: Jan. 3, 2024

(65) Prior Publication Data

US 2025/0217568 A1 Jul. 3, 2025

Related U.S. Application Data

(60) Provisional application No. 63/613,756, filed on Dec. 22, 2023.

(51) Int. Cl.
*G06F 30/392* (2020.01)
*H10D 84/90* (2025.01)

(52) U.S. Cl.
CPC ......... *G06F 30/392* (2020.01); *H10D 84/907* (2025.01); *H10D 84/953* (2025.01); *H10D 84/981* (2025.01)

(58) Field of Classification Search
None
See application file for complete search history.

(56) References Cited

U.S. PATENT DOCUMENTS

2022/0367460 A1* 11/2022 Huang ................. H10D 84/856
* cited by examiner

*Primary Examiner* — Anthony Ho
(74) *Attorney, Agent, or Firm* — WPAT LAW; Anthony King

(57) ABSTRACT

A layout method is provided. A timing analysis is performed based on design data of a standard cell to classify a plurality of device units of the standard cell into a timing-critical group and a non-timing-critical group. A plurality of first sources regions in the device units of the non-timing-critical group are aligned with a plurality of second sources regions in the device units of the timing-critical group in a first direction in floorplan of the standard cell in a layout. The device units of the timing-critical group are arranged in a first row of a cell array and the device units of the non-timing-critical group are arranged in a second row of the cell array. The first and second rows of the cell array share a common power line. First active regions of the first row are wider than second active regions of the second row.

20 Claims, 27 Drawing Sheets

25_2

ROW1

410_A

410_D

410_F1

410_G

410_H1

410_J

410_I

ROW2

LAYOUT METHOD AND SEMICONDUCTOR STRUCTURE FOR IC

PRIORITY CLAIM AND CROSS-REFERENCE

This application claims the benefit of U.S. Provisional Application No. 63/613,756, filed Dec. 22, 2023, the entire disclosure of which is incorporated by reference herein.

BACKGROUND

Electronic equipment involving semiconductor devices is essential for many modern applications. Technological advances in materials and design have produced generations of semiconductor devices, in which each generation includes smaller and more complex circuits than the previous generation. In the course of advancement and innovation, functional density (i.e., the number of interconnected devices per chip area) has generally increased while geometric size (i.e., the smallest component that can be created using a fabrication process) has decreased. Such advances have increased complexity of processing and manufacturing semiconductor devices. Therefore, there is a continuous need to modify the structure and manufacturing method of the devices in order to improve device robustness as well as reducing manufacturing cost and processing time. Among the various studies of the semiconductor devices, advanced types of field-effect transistors (FET), such as nanosheet FET, have attracted a great deal of attentions for their superior performance, e.g., better gate control and improved short channel effect.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 9A is a floorplan of a logic cell corresponding to the standard cell shown in FIG. 4B, in accordance with some embodiments of the present disclosure.

DETAILED DESCRIPTION

Figure 1:
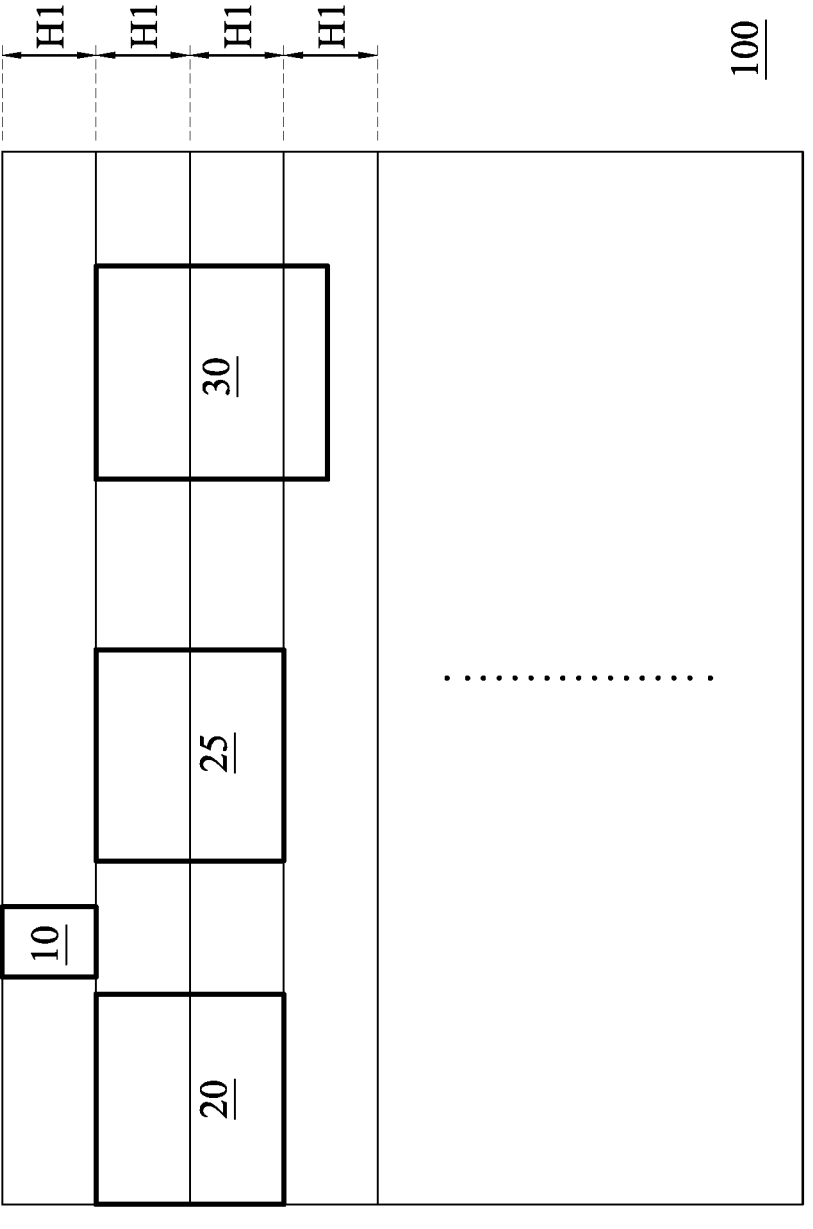
FIG. 1 is a simplified diagram of a cell array of an integrated circuit (IC), in accordance with some embodiments of the disclosure.
Figure 1:
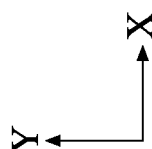

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Various semiconductor structures of integrated circuits (ICs) are provided in accordance with various exemplary embodiments. Some variations of some embodiments are discussed. Throughout the various views and illustrative embodiments, like reference numbers are used to designate like elements.

IC manufacturing process flow is typically divided into three categories: front-end-of-line (FEOL), middle-end-of-line (MEOL), and back-end-of-line (BEOL). FEOL generally encompasses processes related to fabricating IC devices, such as transistors. For example, the FEOL process can include forming isolation features, gate structures, and source and drain features (generally referred to as source/drain features). The MEOL process generally encompasses processes related to fabricating contacts to conductive features (or conductive regions) of the IC devices, such as contacts to the gate structures and/or the source/drain features. The BEOL process generally encompasses processes related to fabricating a multilayer interconnect (MLI) feature that interconnects IC features fabricated by the FEOL and MEOL processes (referred to as FEOL and MEOL features or structures, respectively), thereby enabling operation of the IC devices.

According to the embodiments of the present disclosure, layout methods and associated structures of standard cells based on the nanosheet field-effect transistor (FET) devices are provided. The standard cell includes multiple device units. Through the proposed layout scheme, the timing-critical device units operating in a timing-critical path of the standard cell are arranged in the same row of a cell array and over the wide active regions, and the non-timing-critical device units operating in a non-timing-critical path of the standard cell are arranged in the adjacent row and over the narrow active regions, thereby increasing the speed and performance of the standard cell. Furthermore, by aligning the source regions of the timing-critical device units and the source regions of the non-timing-critical device units in the column direction, the aligned source regions can connect to a common power line without modifying or affecting the power line configuration in BEOL processes, thereby decreasing cost and layout complexity.

FIG. 1 is a simplified diagram of a cell array 100 of an IC, in accordance with some embodiments of the disclosure. The cell array 100 includes multiple logic cells arranged in multiple rows with the height H1. The logic cells are the standard cells (e.g., INV (inverter), AND, OR, NAND, NOR, Flip-Flop, SCAN, etc.), a combination thereof or specific functional cells. The logic cells include the logic cells 10, 20, 25 and 35 with various cell heights. The logic cells 10 are the single-height logic cells having a first cell height that is equal to the height H1. The logic cells 20, 25 and 35 are multi-height logic cells. For example, the logic cells 20 and 25 are the double-height logic cells having a second cell height that is equal to twice the height H1, and the logic cell 35 is a 2.5×-height logic cell having a third cell height that is equal to two and one half times the height H1. The logic cells 20 and 25 have different active region configurations. For example, the logic cell 20 has original active regions and the logic cell 25 has the modified active regions. In other words, the logic cell 20 has the original placement design obtained from a cell library, and the logic cell 25 has a specific placement design that is different from the original placement design. Similarly, the logic cell 35 has a specific placement design that is different from the original placement design.

The term "standard cell" or "logic cell" used throughout the present disclosure refers to a group of circuit patterns in a design layout to implement specific functionalities of a circuit. A standard cell includes various patterns in one or more layers and may be expressed as unions of polygons. A design layout may be initially constructed through placement of a combination of identical or different standard cells during the layout design stage. The geometries of the patterns in the cells may be adjusted at different stages of layout design in order to compensate for design and process effects. A standard cell may cover circuits corresponding to a portion or an entirety of a die to be manufactured. The standard cells may be accessible from cell libraries provided by semiconductor circuit manufacturers or designers.

The logic cells 10, 20, 25 and 35 corresponding to the same function or operation may have the same circuit configuration with different semiconductor structures and/or different layouts. Each of the logic cells 10, 20, 25 and 35 includes multiple transistors. The transistors are nanosheet FET device selected from a group consisting of vertical gate all around (GAA), horizontal GAA, nanowires, nanosheets, or a combination thereof. The number and arrangement of logic cells 10, 20, 25 and 35 in the cell array 100 are for illustrative purposes only and are not intended to limit the disclosure. More logic cells 10, 20, 25 and 35 can be arranged in the cell array 100.

Figure 2A:
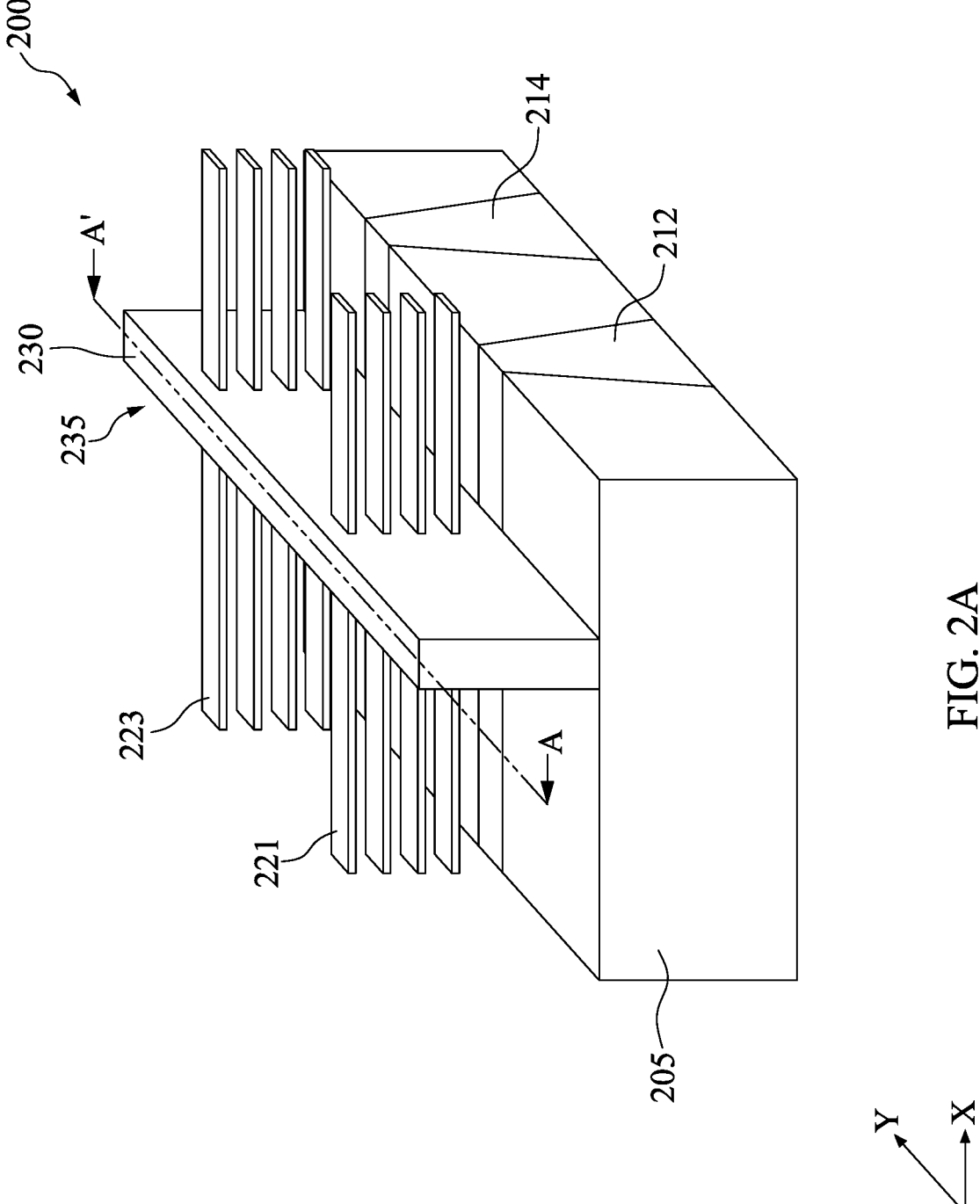
FIG. 2A is a perspective view of a semiconductor structure, in accordance with some embodiments of the present disclosure.

FIG. 2A is a perspective view of a semiconductor structure 200, in accordance with some embodiments of the present disclosure. The semiconductor structure 200 includes the nanosheet FET devices. In FIG. 2A, the semiconductor structure 200 includes the substrates 212 and 214, an isolation region 205, a gate structure 235 including a gate electrode 230, and multiple nano structures 221 and 223.

The substrates 212 and 214 are formed from a same substrate wafer (not shown) and can be seen as two protrusive portions of the substrate wafer. In some embodiments, the substrates 212 and 214 are in a strip shape extending in X direction. The substrates 212 and 214 may be formed from a semiconductor substrate, such as a bulk semiconductor, a semiconductor-on-insulator (SOI) substrate, or the like, which may be doped (e.g., with a p-type or an n-type dopant) or undoped. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate, may also be used. In some embodiments, the semiconductor material of the substrates 212 and 214 may include silicon; germanium; a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; combinations thereof, or the like.

The substrates 212 and 214 are separated from each other by the isolation region 205. In some embodiments, the isolation region 205 has an upper surface level with the upper surfaces of the substrates 212 and 214. The isolation regions 205 may include insulating materials, such as a dielectric material, e.g., silicon oxide, silicon nitride, silicon oxynitride, a combination thereof, or the like. The isolation region 205 may be formed by chemical vapor deposition (CVD), high-density plasma CVD (HDP-CVD), flowable CVD (FCVD), atomic layer deposition (ALD), physical vapor deposition (PVD), a combination thereof, or the like. Other insulation materials formed by any suitable process may be also used. In some embodiments, an annealing process may be performed after the insulation material of the isolation region 205 is deposited.

The gate structure 235 is formed over the substrates 212 and 214 and the isolation region 104. The gate structure 235 may extend in Y direction that is perpendicular to the X direction in which the substrates 212 and 214 extend. In some embodiments, the gate structure 235 includes a gate electrode 230 and a gate insulating layer (not separately shown) and spacers (not separately shown). The gate electrode 230 of the gate structure 235 is made of one or more layers of conductive materials, such as doped polysilicon or metallic materials, e.g., Co, Ru, Al, Ag, Au, W, Ni, Ti, Cu, Mn, Pd, Rc, Ir, Pt, Zr, alloys thereof, combinations thereof, or the like, and may further include other work function adjusting metals, diffusion barrier materials or glue layers.

The nano structures 221 are stacked in Z direction and arranged over the substrate 212, and the nano structures 223 are stacked in Z direction and arranged over the substrate 214. Each of nano structures 221 and 223 generally refers to a two-dimensional semiconductor slab with a length or width greater than about 100 nm and a thickness less than about 20 nm. The nano structures 221 and 223 may extend in a direction, e.g., the X direction, in which the substrates 212 and 214 extend. In some embodiments, the nano structures 221 and 223 extend in a direction perpendicular to the direction in which the gate structure 235 extend. The gate structure 235 wraps around a portion of each of the nano structures 221 and 223. In the depicted example, the nano structures 221 and 223 has four nanosheet stacked over one another, respectively. However, the present disclosure is not limited thereto, and the nano structures 221 and 223 can have an arbitrary number of nanosheets.

In some embodiments, the nano structures 221 and 223 and the substrates 212 and 214 are formed from the same substrate wafer using photolithography and etching operations on this substrate wafer. The nano structures 221 or 223 may be doped with an N-type impurity, e.g., arsenic, phosphorus, or the like, to form an N-type nanosheet FET, or may be doped with a P-type impurity, e.g., boron or the like, to form a P-type nanosheet FET. The nano structures 221 and 223 are configured to form a combined channel region or a combined source/drain region of a nanosheet FET. For example, the portion of each of nano structures 221 which overlaps the gate structure 235 serves as a combined channel region of a first nanosheet FET, while the other portions of each of the nano structures 221 on two sides of the channel region serves as the source/drain regions of the first nanosheet FET. Similarly, the portion of each of the nano structures 223 which overlaps the gate structure 235 serves as a combined channel region of a second nanosheet FET, while the other portions of each of the nano structures 221 on two sides of the channel region of the second nanosheet FET serves as the source/drain regions of the second nanosheet FET. Source/drain region(s) may refer to a source or a drain, individually or collectively dependent upon the context.

In some embodiments, the nano structures 221 and 223 are formed to have substantially equal dimensions, such as the nanosheet length measured in the X direction, the nanosheet width measured in the Y direction and the nanosheet thickness measured in the Z direction. In some embodiments, the nanosheet dimensions of the nano structures 221 may be different from those of the nano structures 223. In some embodiments, the nano structures 221 and 223 have substantially equal nanosheet thicknesses and different nanosheet widths or nanosheet lengths.

Figure 2B:
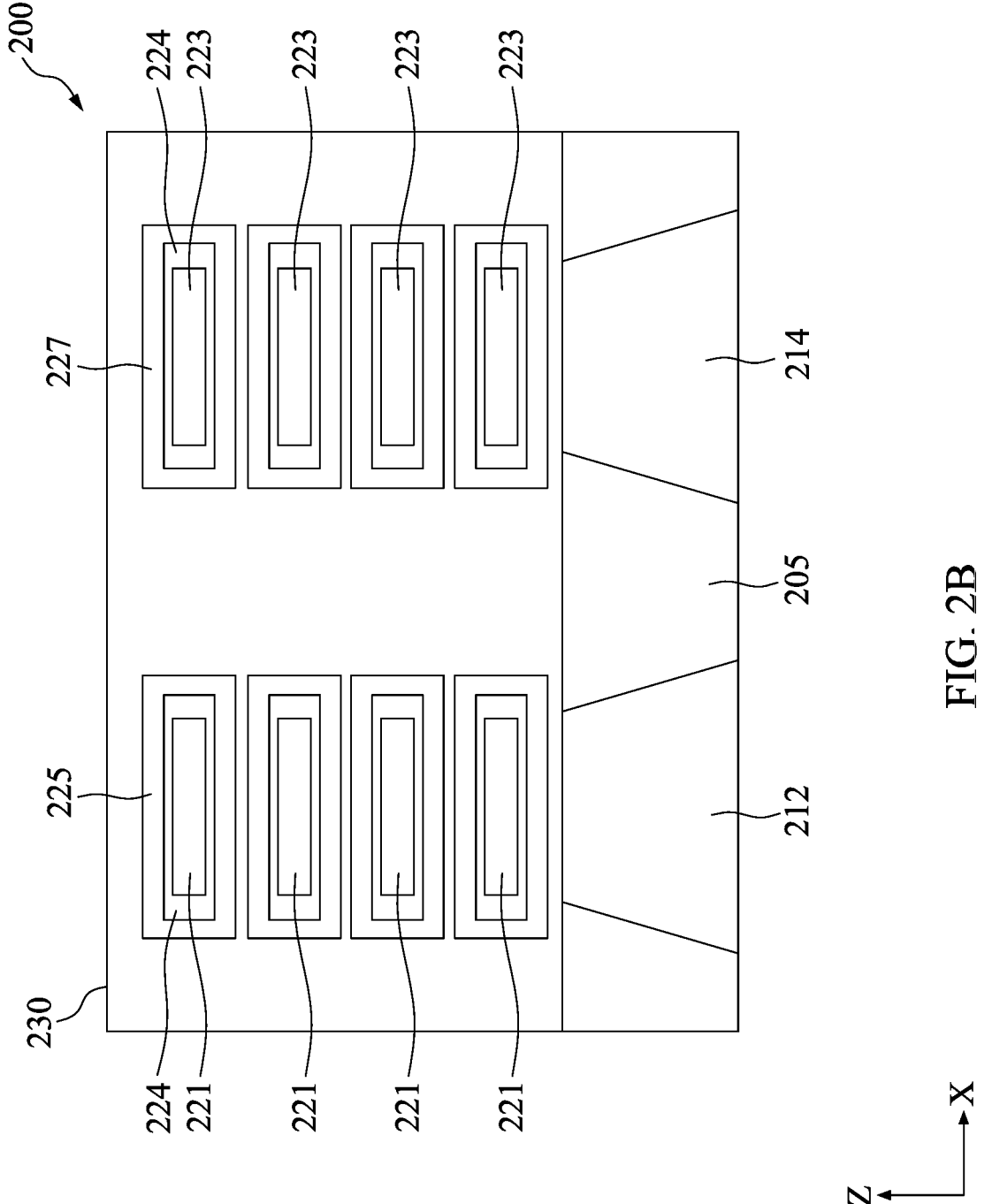
FIG. 2B is a cross-sectional view of the semiconductor structure in FIG. 2A, in accordance with some embodiments of the present disclosure.

FIG. 2B is a cross-sectional view of the semiconductor structure 200 in FIG. 2A, in accordance with some embodiments of the present disclosure. The cross-sectional view of FIG. 2B is taken along the sectional line A-A' cutting through the gate structure 235 of FIG. 2A. In FIG. 2B, the semiconductor structure 200 includes a gate insulating layer 224 between the gate electrode 230 and each of nano structures 221 and 223. The gate insulating layer 224 may be formed of one or more dielectric materials, such as oxide, nitride, oxynitride, or high-k dielectric materials, such as $Al_2O_3$, $HfO_2$, $ZrO_2$, HfOxNy, ZrOxNy, HfSixOy, ZrSixOy, HfSixOyNz, ZrSixOyNz, $TiO_2$, $Ta_2O_5$, $La_2O_3$, $CeO_2$, $Bi_4Si_2O_{12}$, $WO_3$, $Y_2O_3$, $LaAlO_3$, Ba1-xSrxTiO_3, $PbTiO_3$, $BaTiO_3$ (BTO), $SrTiO_3$ (STO), $BaSrTiO_3$ (BST), $PbZrO_3$, lead-strontium-titanate (PST), lead-zinc-niobate (PZN), lead-zirconate-titanate (PZT), lead-magnesium-niobium (PMN), yttria-stabilized zirconia (YSZ), ZnO/Ag/ZnO (ZAZ), a combination thereof, or the like.

In some embodiments, the semiconductor structure 200 further includes a work function adjusting layer 225 and 227 between the gate electrode 230 and the gate insulating layer 224. In the embodiments of an N-type nanosheet FET, the work function adjusting layer is formed of Ti, Ag, Al, TiAl, TiAlN, TiAlC, TaC, TaCN, TaSiN, TaAlC, Mn, Zr, a combination thereof, or the like, and may be formed to wrap around the gate insulating layer 224 by a deposition method such as atomic layer deposition (ALD), chemical vapor deposition (CVD), physical vapor deposition (PVD), a combination thereof, or the like. In the embodiments of a P-type nanosheet FET, the work function adjusting layer is formed of TiN, WN, TaN, Ru, Co, a combination thereof, or the like, and may be formed to wrap around the gate insulating layer 224 by ALD, CVD, PVD, a combination thereof, or the like.

Figure 3:
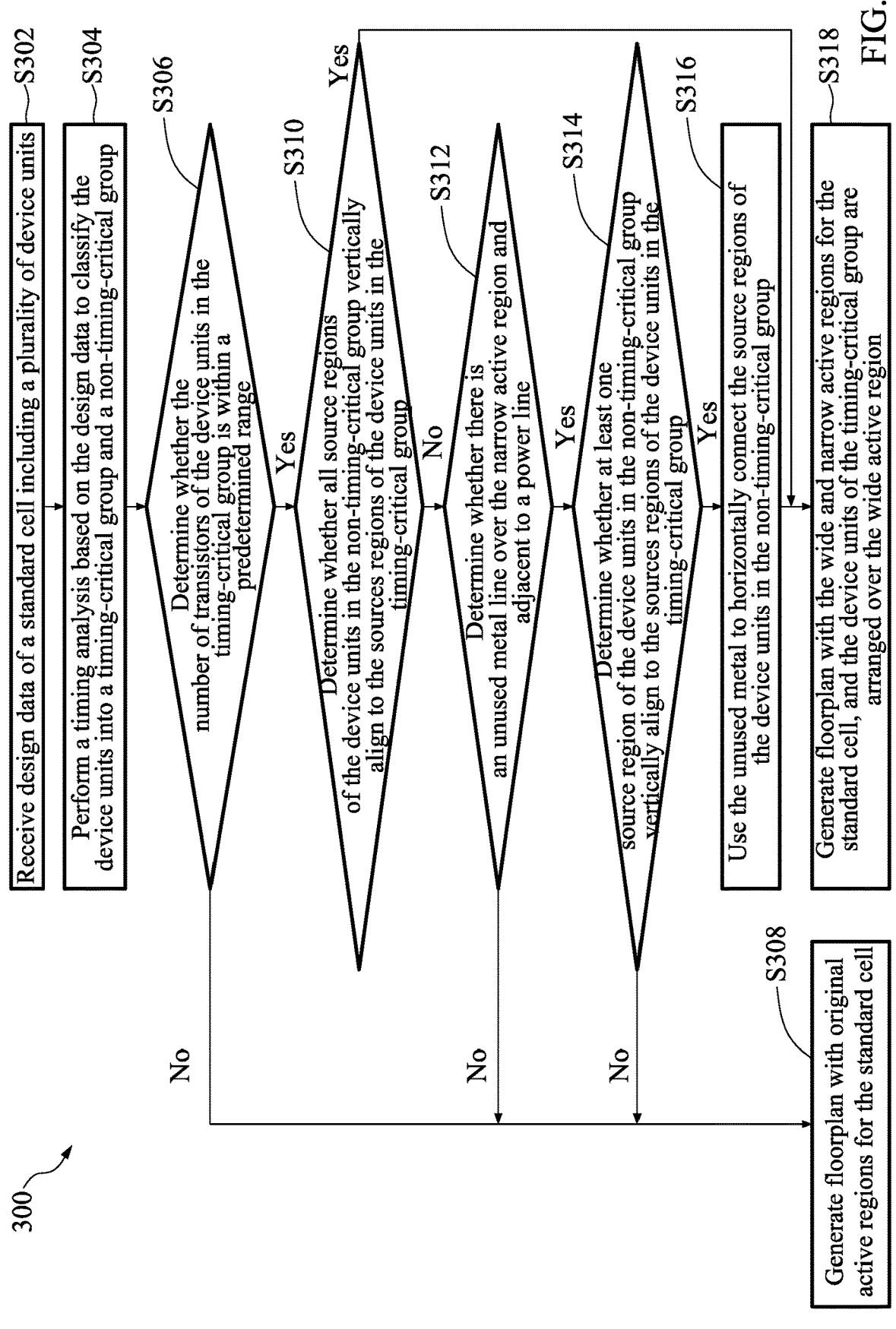
FIG. 3 is a flowchart of a layout method for an IC, in accordance with some embodiments of the present disclosure.

FIG. 3 is a flowchart of a layout method 300 for an IC, in accordance with some embodiments of the present disclosure. The IC includes a logic area formed by numerous standard cells (logic cells) arranged in one or more cell arrays. It should be understood that additional operations can be provided before, during, and after the operations shown in FIG. 3, and some of the operations described below can be replaced or eliminated in other embodiments of the layout method 300. The order of the operations may be interchangeable.

In some embodiments, the layout method 300 may be performed by a computer or processor capable of operating an electronic design automation (EDA) tool. The EDA tool is operated based on the definition of the IC provided in a netlist of circuit elements. A cell library is provided that specifies characteristics of logic cells available for uses in a physical implementation using a given technology of the circuit elements in the netlist. The entries in the library include layout data, performance data such as delay models and power models, and other supporting information. To implement (or sometimes referred to as synthesize) the netlist, the standard cells (or logic cells) are selected from the cell library, placed in a layout space, and interconnections are defined among the standard cells. The selection of standard cells, placement of cells and defining of interconnections among the standard cells are sometimes referred to as place and route procedure. The result of a place and route procedure is a layout, which specifies the physical shapes and locations of respective components/elements of each of the standard cells, and the interconnections of the standard cells. The IC can be made based on the layout.

In the operation S302, design data of a standard cell is received. The standard cell includes multiple device units. The design data may be represented as a netlist, a schematic diagram or a circuit diagram of the device units. In some embodiments, the standard cell may be a latch or a flip flop, and each of the device units includes a logic gate (such as a NAND gate, an inverter gate, an XOR gate, an AND gate, a NOR gate), a transmission gate or at least two transistors with the same conductivity coupled in series. In some embodiments, the design data are generated during a synthesis stage of a design flow for manufacturing the semiconductor structure.

In the operation S304, a timing analysis is performed based on the design data to classify the sub-cells or device units into a timing-critical group and a non-timing-critical group. The timing-critical group includes a first subset of the device units or the sub-cells operating in a timing-critical path, and the non-timing-critical group includes a second subset of the device units or the sub-cells operating in a non-timing-critical path. In other words, the logic cell includes the timing-critical (or timing-related) device units and the non-timing-critical (or timing-independent) device units.

In the operation S306, it is determined whether the number of transistors of the device units in the timing-critical group is within a predetermined percentage range. For example, a transistor ratio of the number of transistors of the device units in the timing-critical group and the number of all transistors of all device units is obtained, and then it is determined whether the transistor ratio is within the predetermined percentage range. In some embodiments, the predetermined percentage range is defined by a first ratio of transistors (e.g., 0.4) and a second ratio of transistors (e.g., 0.6) between the timing-critical device units and all the device units, i.e., the predetermined range may be greater than or equal to the first ratio and less than or equal to the second ratio.

Figure 4A:
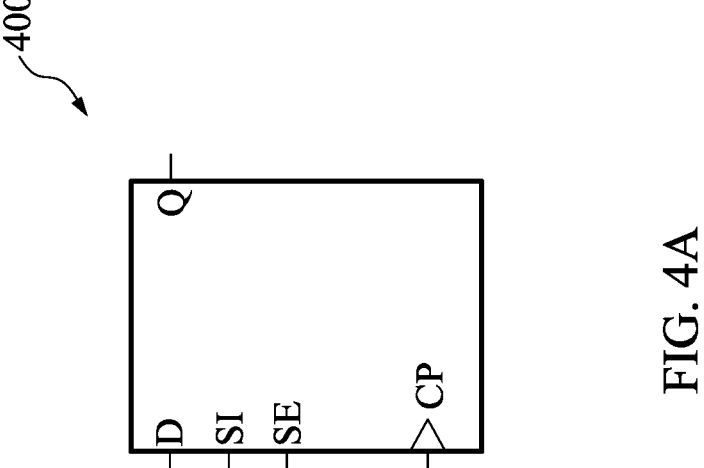
FIG. 4A is a symbol of a D flip-flop with a scan input (SDFQ).
Figure 4B:
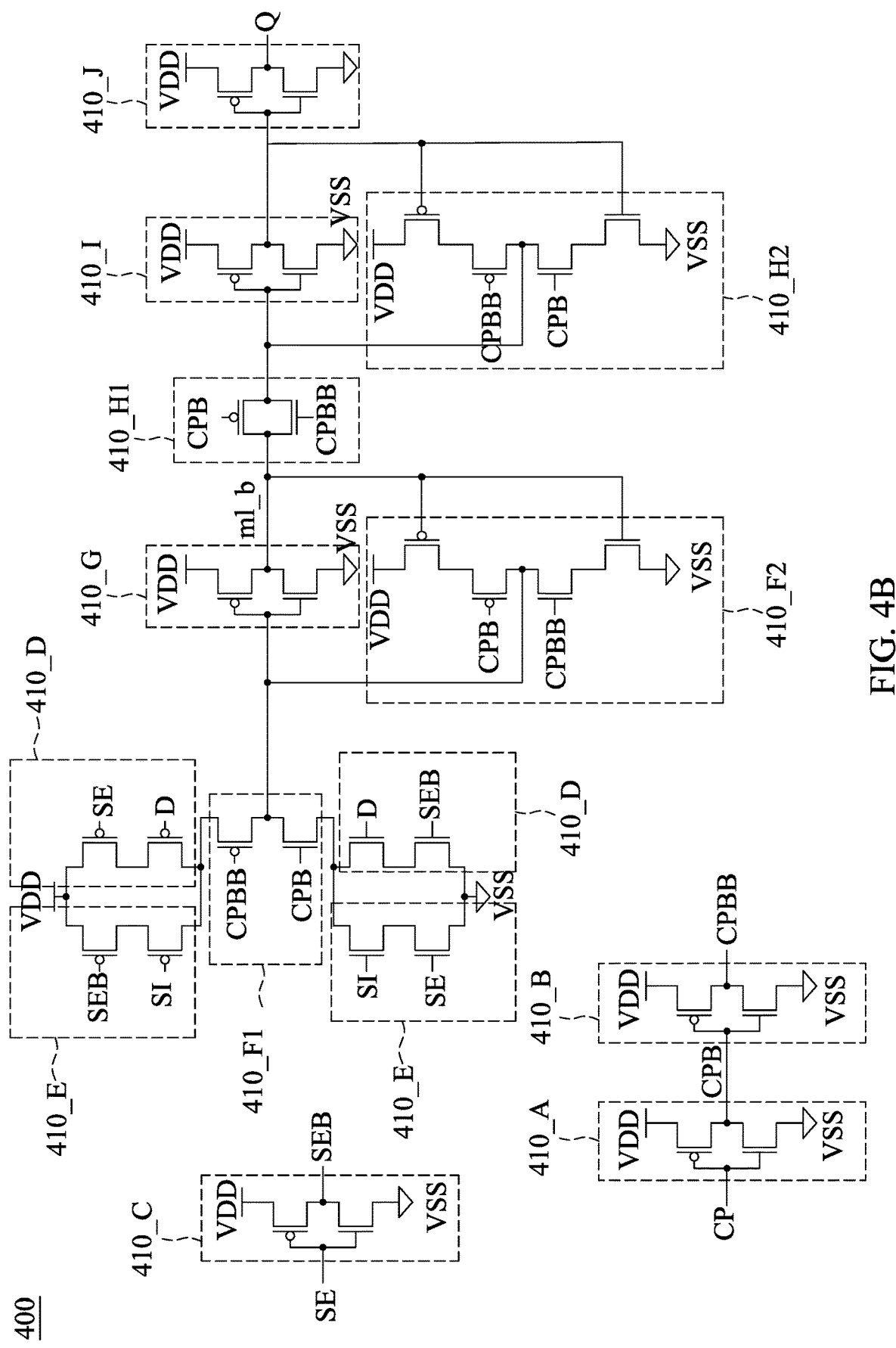
FIG. 4B is a circuit diagram of the SDFQ shown in FIG. 4A, in accordance with some embodiments of the present disclosure.

Referring to FIG. 4A and FIG. 4B, a standard cell is used to illustrate the transistor ratio. FIG. 4A is a symbol of a D flip-flop with scan input (SDFQ) 400, and FIG. 4B is a circuit diagram of the SDFQ 400. The SDFQ 400 is a type of D flip-flop (DFF) which is controllable to select either an input signal D or a scan signal SI to generate an output signal Q according to the clock signal CP and the scan enable signal SE. The SDFQ 400 is implemented by the device units 410_A through 410_J. For example, the device units 410_A and 410_B are the inverters for the clock signal CP. The device unit 410_C is an inverter for the scan enable signal SE. The device unit 410_D is an input multiplexer for the input signal D in the non-scan mode. The device unit 410_E is an input multiplexer for the scan signal SI in the scan mode. The device unit 410_F1 is a master latch configured to latch the data in response to arrival of the clock signal CP, and the device unit 410_F2 is configured to provide a feedback signal for the master latch. The device unit 410_G is an inverter for the master latch. The device unit 410_H1 is a transmission gate configured to function as a slave latch for latching the data in response to arrival of the clock signal CPB, and the device unit 410_H2 is configured to provide a feedback signal for the slave latch. The device unit 410_I is an inverter for the slave latch. The device unit 410_J is an inverter configured to function as a driver to output the output signal Q. In the embodiment of FIG. 4B, the device units 410_A through 410_J may include the inverter, the transmission gate, or two P-type transistors connected in series and two N-type transistors connected in series.

In the SDFQ 400, the flop speed is calculated by $1/(T_{setup}+T_{cp2q})$. $T_{setup}$ is the data arrival time before clock transition and is defined as $T_{D2ml\_b}$ (delay from the input signal D to the output ml_b of the device unit 410_G) minus $T_{ck2mTXG}$ (delay from the clock signal CP to the device unit 410_F1), i.e., $T_{setup}=T_{D2ml\_b}-T_{ck2mTXG}$. $T_{cp2q}$ is the output delay time and is defined as $T_{ck2slTXG}$ (delay from the clock signal CP to the device unit 410_H1) plus $T_{ml\_b2Q}$ (delay from the output ml_b of the device unit 410_G to the output signal Q), i.e., $T_{cp2q}=T_{ck2slTXG}+T_{ml\_b2Q}$. Thus, it is determined that the device units 410_D, 410_F1, 410_G, 410_H1, 410_I and 410_J are in the timing-critical path, and the device units 410_A, 410_B, 410_C, 410_E, 410_F2 and 410_H2 are in the non-timing-critical path. In the embodiment of FIG. 4B, the SDFQ 400 includes 32 transistors in all device units 410_A through 410_J, and the device units 410_D, 410_F1, 410_G, 410_H1, 410_I and 410_J of the timing-critical group include 14 transistors. Thus, the transistor ratio is equal to 14 divided by 32.

Referring back to the operation S306 of FIG. 3, if it is determined that the number of transistors of the device units in the timing-critical group is outside the predetermined range (e.g., the transistor ratio is less than the first threshold or greater than the second threshold), the layout method 300 enters the operation S308 and then a floorplan with original active regions and the related layout are generated for the standard cell. The logic cell (e.g., the logic cell 20 of FIG. 1) with the original active regions will be described below in greater detail. Conversely, if it is determined that the number of transistors of the device units in the timing-critical group is within the predetermined range in the operation S306 (e.g., the transistor ratio of the SDFQ 400 in FIG. 4 is within the predetermined range, i.e., 0.4≤14/32≤0.6), the device units of the non-timing-critical group and the device units of the timing-critical group are arranged in two different adjacent rows of the cell array and over the active regions modified into different sizes, and the layout method 300 enters the operation S310.

In the operation S310, the device units of the non-timing-critical group are arranged in the row corresponding to the narrow active regions and the device units of the non-timing-critical group are arranged in the row corresponding to the wide active regions, and then it is determined whether all source regions of the device units in the non-timing-critical group are vertically aligned with the sources regions of the device units in the timing-critical group in the layout. If it is determined that all source regions of the device units in the non-timing-critical group are vertically aligned with the sources regions of the device units in the timing-critical group, the method 300 enters the operation S318 and then a floorplan with the modified wide and narrow active regions and the related layout are generated for the standard cell. The logic cell (e.g., the logic cell 25 or 35 of FIG. 1) with the modified active regions will be described later in greater detail. Conversely, if it is determined that the source regions of the device units in the non-timing-critical group are not completely aligned with the sources regions of the device units in the timing-critical group in the operation S310, the method 300 enters the operation S312.

In the operation S312, it is determined whether there is an unused metal line over the narrow active region and adjacent to a power line. The power line and the unused metal line are formed in the same metal layer, e.g., the lowest metal layer in the BEOL structure. If no unused metal line is available (e.g., not enough routing space to place a metal line), the method 300 enters the operation S308, and then the floorplan with original active regions and the related layout are generated for the standard cell. Conversely, if it is determined that the unused metal line is available, the method 300 enters the operation S314.

In the operation S314, it is determined whether at least one source region of the device units in the non-timing-critical group is vertically aligned with the sources regions of the device units in the timing-critical group. If no source region in the non-timing-critical group is vertically aligned with the sources regions in the timing-critical group, the method 300 enters the operation S308, and then the floorplan with original active regions and the related layout are generated for the standard cell. Conversely, if it is determined that at least one source region of the device units found in the non-timing-critical group is vertically aligned with the sources regions of the device units in the timing-critical group, the method 300 enters the operation S316.

In the operation S316, the unused metal line is used to horizontally connect the non-aligned source regions of the device units in the non-timing-critical group, so that the non-aligned source regions in the narrow active region are electrically connected to a common power line shared by the two different adjacent rows. Next, in the operation S318, a floorplan with the modified wide and narrow active regions and the related layout are generated for the standard cell.

Figure 5:
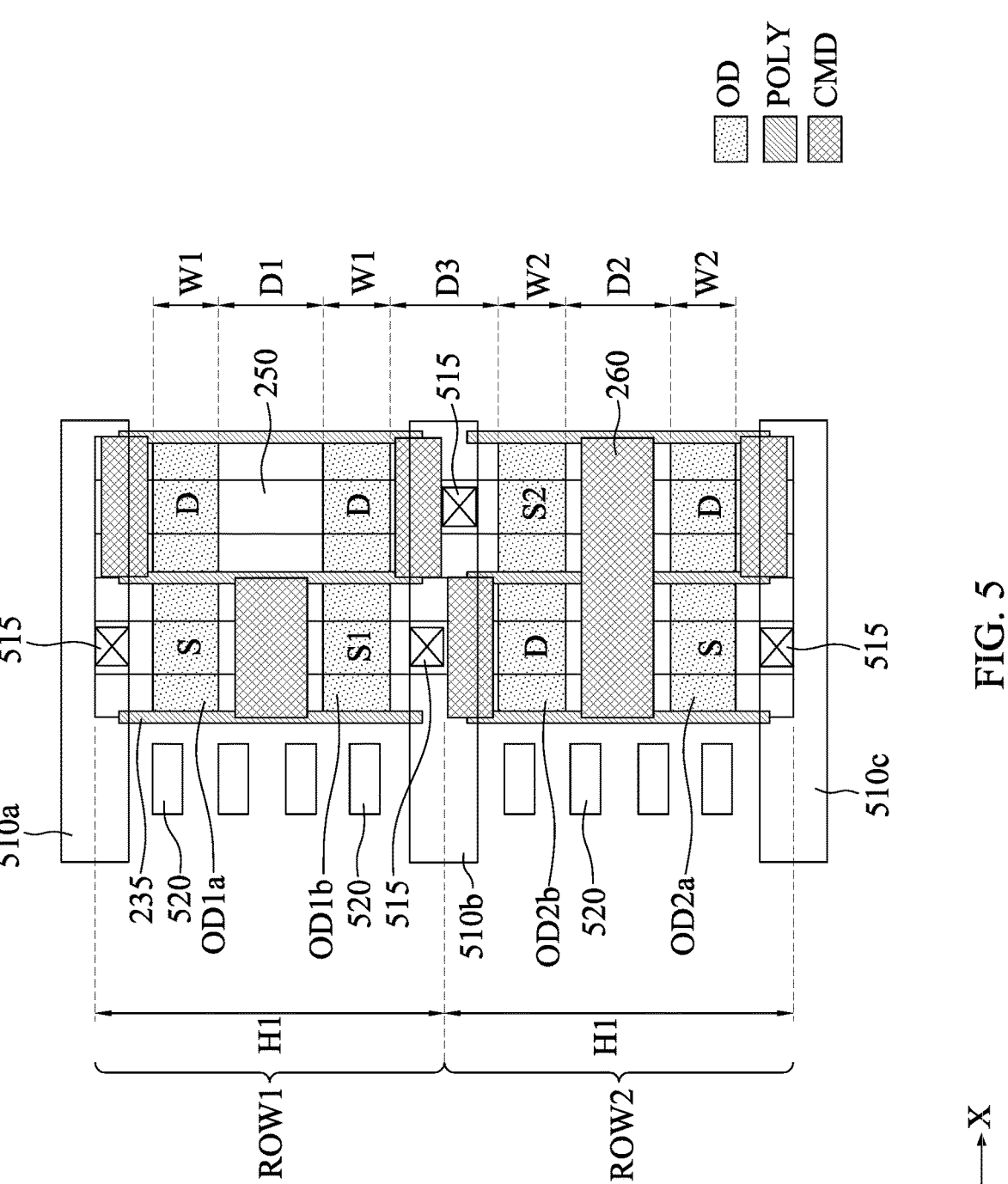
FIG. 5 is a layout illustrating a logic cell with original active regions, in accordance with some embodiments of the present disclosure.

FIG. 5 is a layout illustrating the logic cell with the original active regions, in accordance with some embodiments of the present disclosure. The logic cell is a multi-height logic cell arranged in the rows ROW1 and ROW2 of a cell array. In order to simplify the explanation, only part of the layout of the logic cell is shown in FIG. 5.

The embodiment of FIG. 5 is obtained according to the operations S302, S304, S306 and S308 of the layout method 300 in FIG. 3, and the floorplan with the original active regions is generated in response to a determination that the number of transistors of the device units in the timing-critical group is outside the predetermined range in the operation S306 of FIG. 3.

The power lines 510a, 510b and 510c and multiple metal lines 520 are formed in the lowest metal layer and extend in the X direction. The power lines (or power rails) 510a and 510b are arranged on an upper side and a lower side of the row ROW1, respectively, and the power lines 510b and 510c are arranged on an upper side and a lower side of the row ROW2. Multiple metal lines 520 are arranged between two adjacent of the power lines 510a, 510b and 510c. The pitch of power lines 510a, 510b, and 510c is equal to H1. The power line 510b is a common power line shared by the rows ROW1 and ROW2. In some embodiments, the power lines 510a and 510c are configured to supply a first voltage, and the power line 510b is configured to supply a second voltage different from the first voltage. In some embodiments, the first voltage is VDD and the second voltage is ground (i.e., VSS), or vice versa. The metal lines 520 are the signal lines for transmitting the signals in the rows ROW1 and ROW2. In order to illustrate the FEOL/MEOL structure more clearly, the extended metal lines 520 are illustrated to extend only a small distance in the X direction. However, the metal lines 520 actually extend across the logic cell in the X direction, in a manner similar to the power lines 510a, 510b, and 510c. Furthermore, the maximum number of the metal lines 520 between the power lines 510a and 510b is equal to the maximum number of the metal lines 520 between the power lines 510b and 510c, for example, up to four metal lines 520.

Each of the rows ROW1 and ROW2 defines two active regions (or oxide diffusion (OD) areas) along the X direction, in which the two active regions have opposite conductivities. For example, an active region OD1a in the row ROW1 and an active region OD2a in the row ROW2 denote the active regions doped with N-type dopants, and the active region OD1b in the row ROW1 and the active region OD2b in the row ROW2 denote the active regions doped with P-type dopants. Furthermore, the top views of each of the active regions OD1a, OD1b, OD2a and OD2b shown in FIG. 5 correspond to areas occupied by a stacked nano structure, e.g., the nano structures 221 and 223 stacked in the Z direction as shown in FIG. 2A, of the semiconductor device. As a result, the configurations of the active regions OD1a, OD1b, OD2a and OD2b will determine the planar dimensions of the nanosheets in the transistors of the logic cell.

In some embodiments, the active regions OD1a and OD1b have substantially equal widths W1 in the Y direction, and the active regions OD2a and OD2b have substantially equal widths W2 in the Y direction. The width W1 may be substantially equal to or different from the width W2. In some embodiments, the widths W1 and W2 are equal to about 21 nanometer (nm). A space between the active regions OD1a and OD1b in the row ROW1 is D1, and a space between the active regions OD2a and OD2b in the row ROW2 is D2. The space D1 may be substantially equal to or different from the space D2. A space between the active regions OD1b and OD2b is D3. In some embodiments, a minimum space of the active regions is determined by the space D3. Furthermore, in some embodiments, the active regions OD1a through OD2b do not overlap the power lines 510a through 510c in the logic cell.

The gate structures 235 extend in the Y direction, and portions of the active regions OD1a, OD1b, OD2a and OD2b surrounded by the gate structures 235 (or poly) form the channel regions for the semiconductor devices in the rows ROW1 and ROW2. Multiple contact features (or connecting features) 250 extending in the Y direction are formed between the adjacent gate structures 235. Each contact feature 250 is a conductive line configured to electrically connect the source region (denoted as S) or the drain region (denoted as D) of the transistor to overlying or underlying layers of the logic cell. For example, the source regions S are electrically connected to the power lines 510a, 510b and 510c through the vias (or the connecting features) 515. The contact features 250 may be formed of doped polysilicon or metallic materials, such as copper, tungsten, titanium, titanium nitride, tantalum, tantalum nitride, or the like. In FIG. 5, the source regions S in the row ROW1 are not vertically aligned with the source regions S in the row ROW2. For example, the source region S1 is not vertically aligned with the source region S2 in FIG. 5, and the non-aligned source regions S1 and S2 are configured to connect to the same power line 510b through the respective vias 515.

In some embodiments, the logic cell in FIG. 5 further includes a line separation pattern CMD, referred to herein as a "cut-MD pattern" extending in the X direction to overlap some of the contact features 250. The cut-MD pattern CMD is used to signify an MD separation step during the semi-conductor fabrication process, by which the contiguous contact features 250 are segmented into aligned segments with predetermined line lengths. Furthermore, the cut-MD pattern CMD does not overlap the active regions OD1a through OD2b. The positions of the cut-MD patterns CMD are shown in FIG. 5 for illustrational purposes.

Figure 6A:
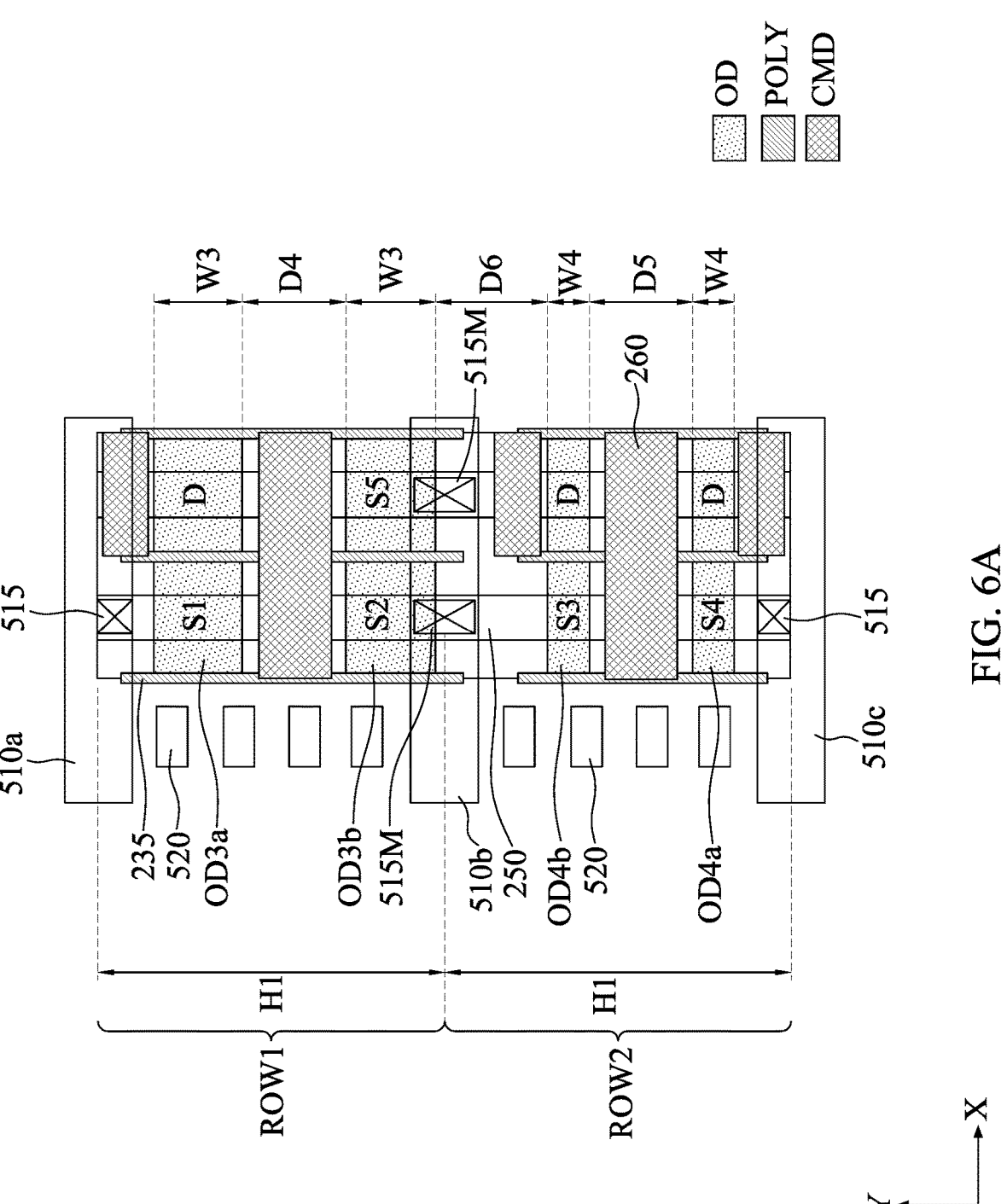
FIGS. 6A and 6B are respective layouts illustrating modified wide and narrow active regions of a logic cell, in accordance with some embodiments of the present disclosure.

FIG. 6A is a layout illustrating the modified wide and narrow active regions of a first type of the logic cell, in accordance with some embodiments of the present disclosure. The logic cell is a multi-height logic cell arranged in the rows ROW1 and ROW2 of a cell array. In order to simplify the explanation, only part of the layout of the logic cell is shown in FIG. 6A.

The embodiment of FIG. 6A is obtained according to the operations S302, S304, S306, S310 and S318 of the layout method 300 in FIG. 3, and the floorplan with the wide and narrow active regions is generated in response to a deter-mination that the number of transistors of the device units in the timing-critical group is within the predetermined range in the operation S306 of FIG. 3 and all source regions of the device units in the non-timing-critical group are vertically aligned to the sources regions of the device units in the timing-critical group in the operation S310 of FIG. 3.

Compared with the logic cell in FIG. 5, a width W3 of active regions OD3a and OD3b is greater than the width W1 of the active regions OD1a and OD1b in the row ROW1, and a width W4 of active regions OD4a and OD4b is less than the width W2 of the active regions OD2a and OD2b in the row ROW2. In other words, the width W3 is greater than the width W4. In some embodiments, the width W3 is equal to about 31 nm and the width W4 is equal to about 11 nm, and the ratio of widths W3 and W4 exceeds 2.5. As described above, the device units of the timing-critical group are arranged in the first row ROW1 with the wide active regions OD3a and OD3b, and the device units of the non-timing-critical group are arranged in the second row ROW2 with the narrow active regions OD4a and OD4b. In some embodiments, the wide active region OD3b in the row ROW1 may extend to or beyond the boundary between the rows ROW1 and ROW2.

A space D4 between the active regions OD3a and OD3b may be substantially equal to or different from the space D1. Furthermore, a space D5 between the active regions OD4a and OD4b may be substantially equal to or different from the space D2. In some embodiments, a space D6 between the active regions OD3b and OD4b may be substantially equal or different from to the space D3.

In the embodiment of FIG. 6A, the active region OD3b overlaps the power line 510b, and the source regions S3 and S4 of the row ROW2 are vertically aligned with the source regions S1 and S2 of the row ROW1 in the Y direction, so that the vias 515 and the vias 515M corresponding to the aligned source regions S1 through S4 are also vertically aligned in the Y direction. In the row ROW1, the source regions S2 and S5 belong to different transistors. For example, one transistor includes the source region S2 and a drain region (not shown) on the left side of the source region S2, and another transistor includes the source region S5 and a drain region (not shown) on the right side of the source region S5. Furthermore, all the source regions in the narrow active regions OD4a and OD4b need to be aligned with the source regions in the wide active regions OD3a and OD3b, as shown in the source regions S1 through S4. However, the source regions in the wide active regions OD3a and OD3b do not need to be aligned with the source regions in the narrow active regions OD4a and OD4b, as shown in the source region S5.

The vias 515M have greater size than the vias 515, and are used to electrically connect the corresponding contact fea-ture 250 to the power line 510b. In some embodiments, two adjacent vias 515 overlapping the power line 510b are merged to form the via 515M. In the embodiments of the disclosure, the active regions OD3a, OD4a and OD4b do not overlap the power lines of the cell array.

For the active regions with various widths, the traditional multiple-height logic cell having the equal-height arrange-ment (i.e., the adjacent pairs of the power lines have equal pitches) may cause that the source regions in the narrower active regions can not directly connected to the common power line, i.e., the via corresponding to the source region in the narrower active region may overlap the signal lines instead of the power line. Compared with the traditional logic cells having the equal-height arrangements, the aligned source region S3 in the modified narrow active region OD4b can directly connect to the common power line 510b through the via 515M, thereby reducing the routing and layout complexity.

Figure 6B:
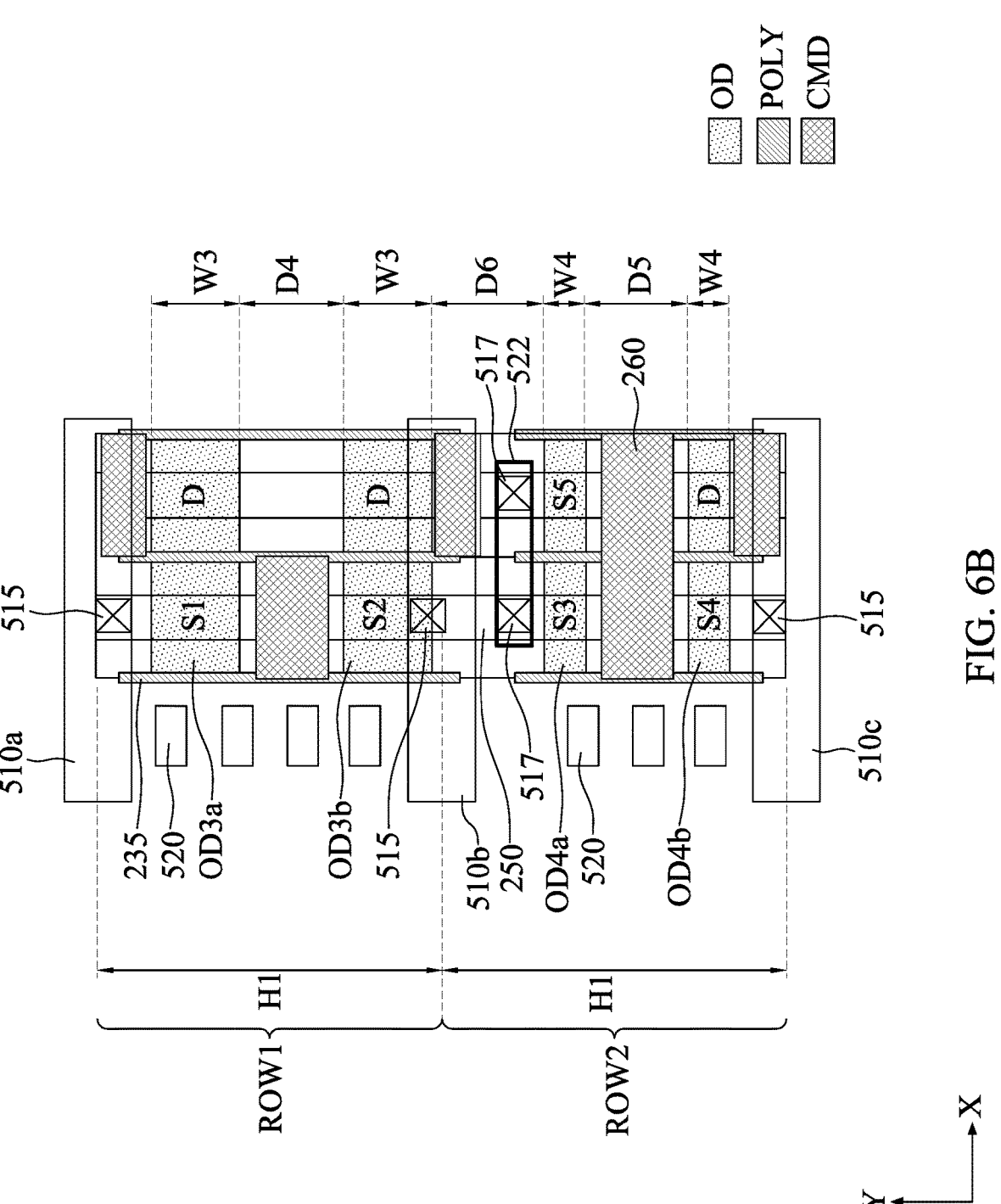

FIG. 6B is a layout illustrating the modified wide and narrow active regions of a second type logic cell, in accor-dance with some embodiments of the present disclosure. The logic cell is a multi-height logic cell arranged in the rows ROW1 and ROW2 of the cell array. In order to simplify the explanation, only part of the layout of the logic cell is shown in FIG. 6B.

The embodiment of FIG. 6B is obtained according to the operations S302, S304, S306, S310, S312, S314, S316 and S318 of the layout method 300 in FIG. 3, and the floorplan with the wide and narrow active regions is generated in response to a determination that the number of transistors of the device units in the timing-critical group is within the predetermined range in the operation S306 of FIG. 3 and the source regions of the device units in the non-timing-critical group are not completely aligned to the sources regions of the device units in the timing-critical group in the operation S310 of FIG. 3. Furthermore, it is further determined that an unused metal line is available in the operation S312 of FIG. 3 and at least one source region of the device units in the non-timing-critical group is vertically aligned with the sources regions of the device units in the timing-critical group in the operation S314 of FIG. 3.

Compared with the logic cell in FIG. 6A, the metal line 522 is used in the logic cell of FIG. 6B. The metal line 522 is closest to the power line 510*b* in the ROW2, and the metal line 522 may be considered as the unused metal line 520 described in the operation S312 of FIG. 3. The metal line 522 is configured to connect the source region S5 to the power line 510*b* through the vias 517 and the contact feature 250 corresponding to the source regions S2 and S3. The source regions S3 and S5 belong to different transistors. In some embodiments, the vias 517 do not overlap the power lines 510*b* and 510*c*. In the embodiment of FIG. 6B, the source regions S1, S2, S3 and S4 are vertically aligned in the Y direction, and the source region S5 is not aligned with other source regions in the row ROW1.

For the active regions with various widths, the traditional multiple-height logic cell having the different height arrangement (i.e., the adjacent pairs of the power lines have different pitches) may cause that the routing space over the narrow active region is limited and is hard to route. Compared with the traditional logic cells having different height arrangements, the power lines 510*a*, 510*b*, and 510*c* have substantially equal pitches, thereby it is easy to place the signal lines between the power lines 510*a*, 510*b*, and 510*c*, thereby reducing the routing and layout complexity.

According to the embodiments in FIG. 6A and FIG. 6B, the logic cells has the equal-height arrangement in the FEOL, MEOL and BEOL processes. Therefore, when the size (or width) of the active region OD3*a* and OD3*b* is increased from the width W1 to the width W3 in the FEOL and MEOL structures and the size (or width) of the active region OD4*a* and OD4*b* is decreased from the width W2 to the width W4 in the FEOL and MEOL structures, the layout configuration of the BEOL structures will not need to be modified accordingly. For example, in the traditional cell array, in order to facilitate the connection between the source regions of the device units and the power lines, it is necessary to enlarge the distance between the two adjacent power lines corresponding to the wide active region, so that the power lines in the cell array have unequal pitches (that is, the two adjacent power lines corresponding the wide active region have a larger pitch, and the two power lines corresponding the narrow active region have smaller pitch. Compared with the traditional logic cells, the aligned source regions in the modified narrow active region can connect to the common power line directly through the vias 515M as shown in FIG. 6A or through the specific metal line as shown in 522 of FIG. 6B without modifying the power configuration in the BEOL structure, i.e., the pitch of the power lines in the cell array is equal. Under the design of an isometric power line pitch, more routing resources for BEOL processes would be saved because there is more routing space for the cell array, thereby speeding up layout time and decreasing cost and layout complexity without increasing the cell array area. Furthermore, by arranging the device units of the timing-critical group in the modified wide active regions, the speed of the standard cells is increased and the performance of the cell array is improved.

Figure 7A:
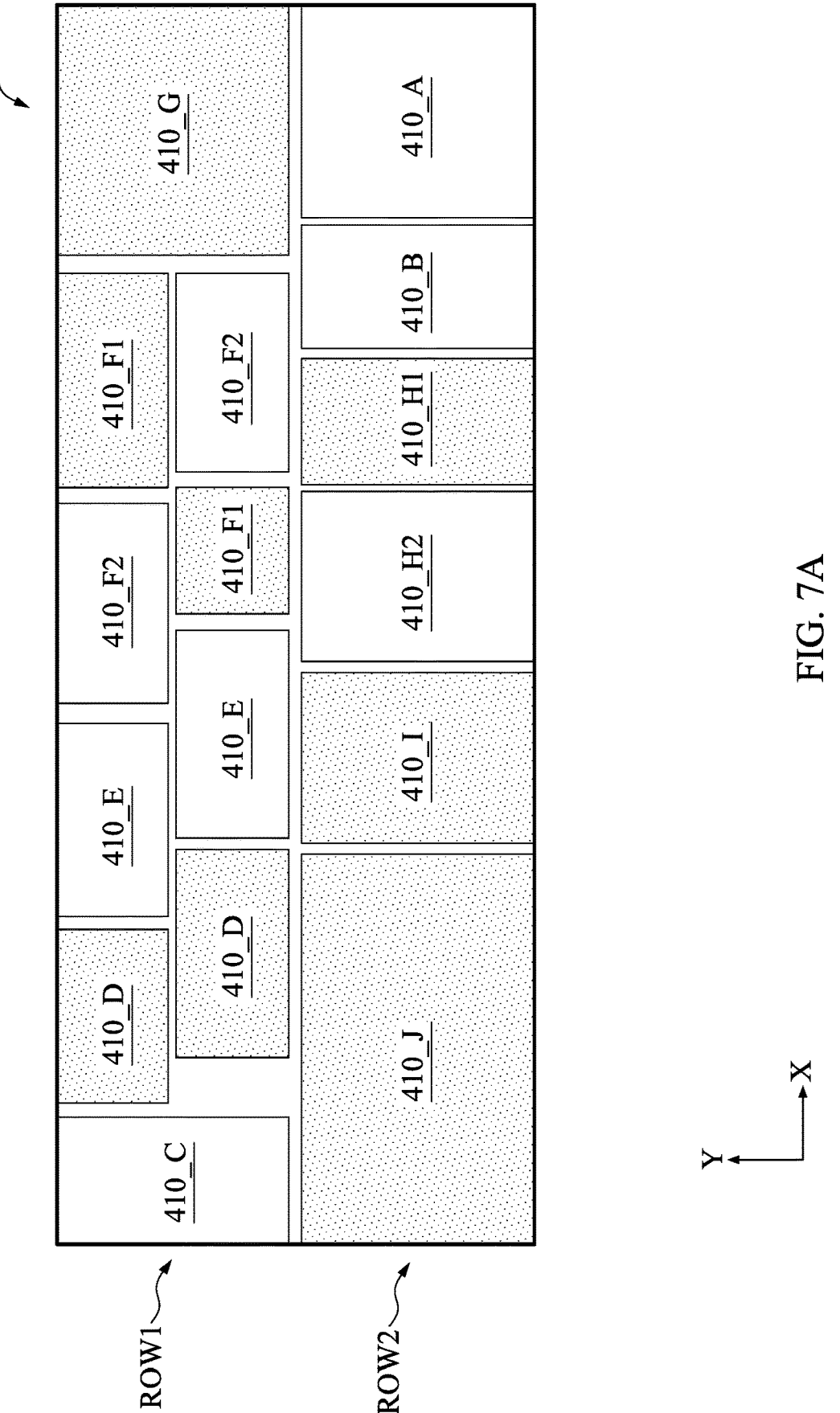
FIG. 7A is a floorplan of a logic cell corresponding to the standard cell shown in FIG. 4B, in accordance with some embodiments of the present disclosure.
Figure 7B:
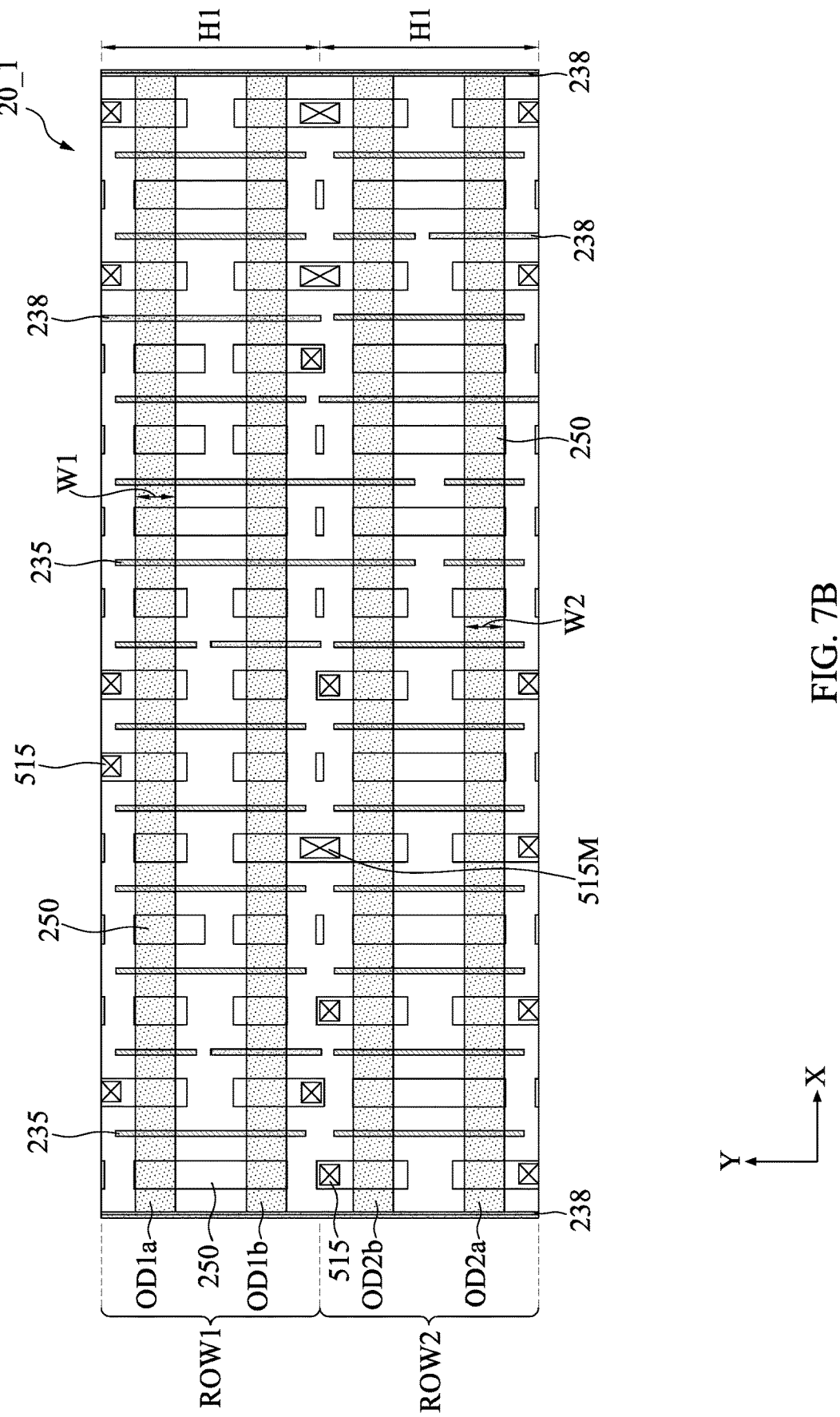
FIG. 7B and FIG. 7C are respective layouts of an FEOL/MEOL structure and a BEOL structure of the logic cell shown in FIG. 7A, in accordance with some embodiments of the present disclosure.

FIG. 7A is a floorplan of a logic cell 20_1 corresponding to the standard cell 400 in FIG. 4B, in accordance with some embodiments of the present disclosure. FIG. 7B is a layout of the FEOL/MEOL structure of the logic cell 20_1 in FIG.

Figure 7C:
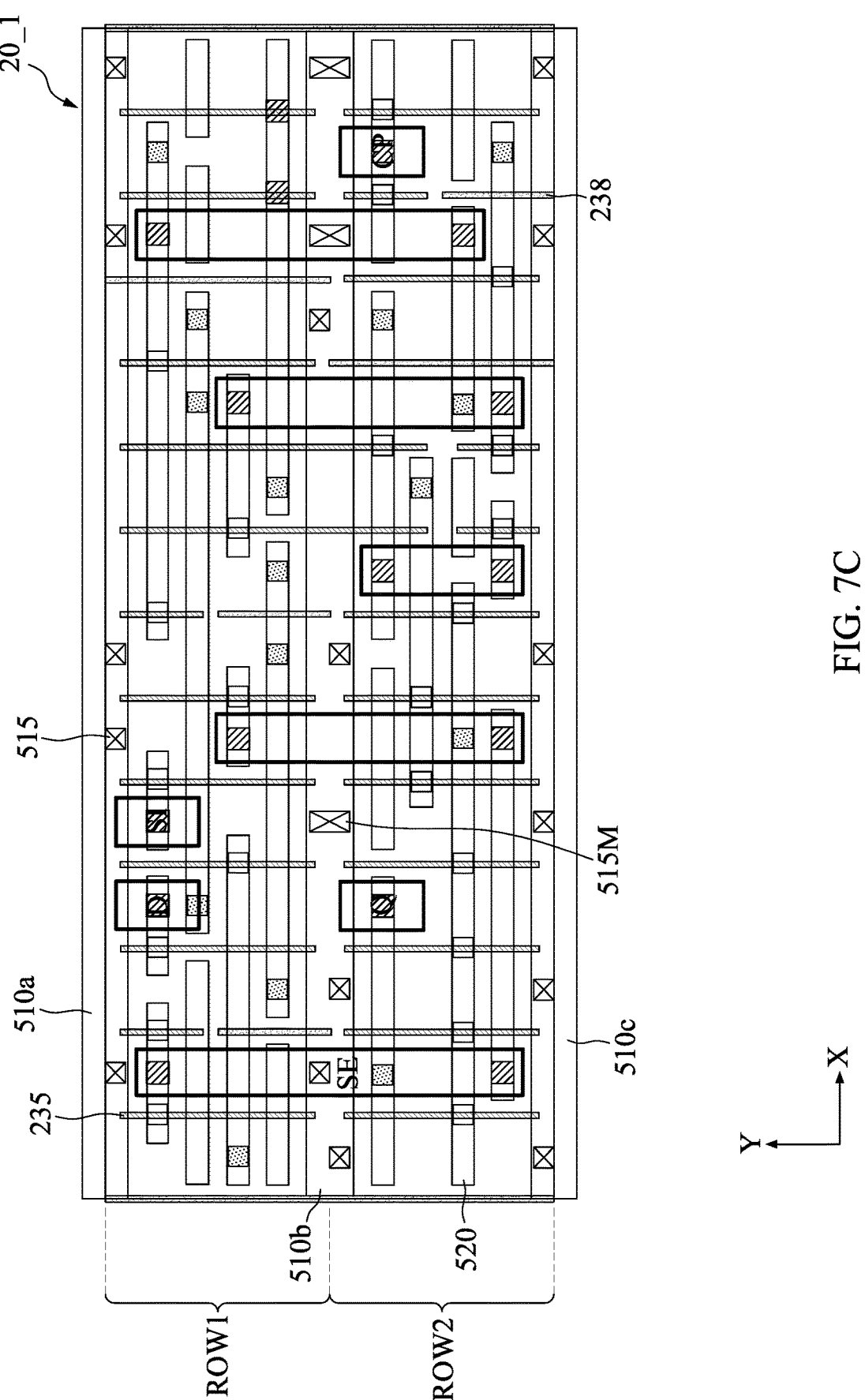

7A and FIG. 7C is a layout of the BEOL structure of the logic cell 20_1 in FIG. 7A, in accordance with some embodiments of the present disclosure.

The embodiment of the logic cell 20_1 is obtained according to the operations S302, S304, S306 and S308 of the layout method 300 in FIG. 3, and the floorplan with the original active regions is generated in response to a determination that the number of transistors of the device units in the timing-critical group is outside the predetermined range in the operation S306 of FIG. 3.

In the rows ROW1 and ROW2, the logic cell 20_1 is separated from other logic cells (not shown) by the isolation structures 238 on the left and right sides (see FIGS. 7B and 7C). The isolation structures 238 are formed by continuous poly on diffusion edge (CPODE) processes. The isolation structures 238 may be referred to as the CPODE structures, dielectric gate structures or dummy gate structures, and are configured to divide the active regions into different sizes. For example, the active regions OD1*a* and OD1*b* are separated from the active regions of the adjacent device cells on both sides in the row ROW1, so that the size of the active regions OD1*a* and OD1*b* may be different from that of the active regions in the adjacent device cells. Similarly, the active regions OD2*a* and OD2*b* are separated from the active regions of the adjacent device cells on both sides in the row ROW2, so that the size of the active regions OD2*a* and OD2*b* may be different from that of the active regions in the adjacent device cells. In some embodiments, the active regions OD2*a* and OD2*b* and the active regions OD1*a* and OD1*b* have substantially equal widths in the Y direction, i.e., W1=W2.

As described above, the device units 410_A through 410_J of the standard cell 400 are divided into the timing-critical group and the non-timing-critical group. The timing-critical group includes the device units 410_D, 410_F1, 410_G, 410_H1, 410_I and 410_J, and the non-timing-critical group include the remaining device units.

In the logic cell 20_1, the device units of the timing-critical group are arranged in the rows ROW1 and ROW2, and the device units of the non-timing-critical group are also arranged in the rows ROW1 and ROW2. Furthermore, the source regions in the rows ROW1 and ROW2 are not aligned along the Y direction. Since the vias 515M does not overlap the active regions OD1*b* and OD2*b*, the common power line 510*b* between the rows ROW1 and ROW2 does not overlap the active regions OD1*b* and OD2*b*.

Figure 8A:
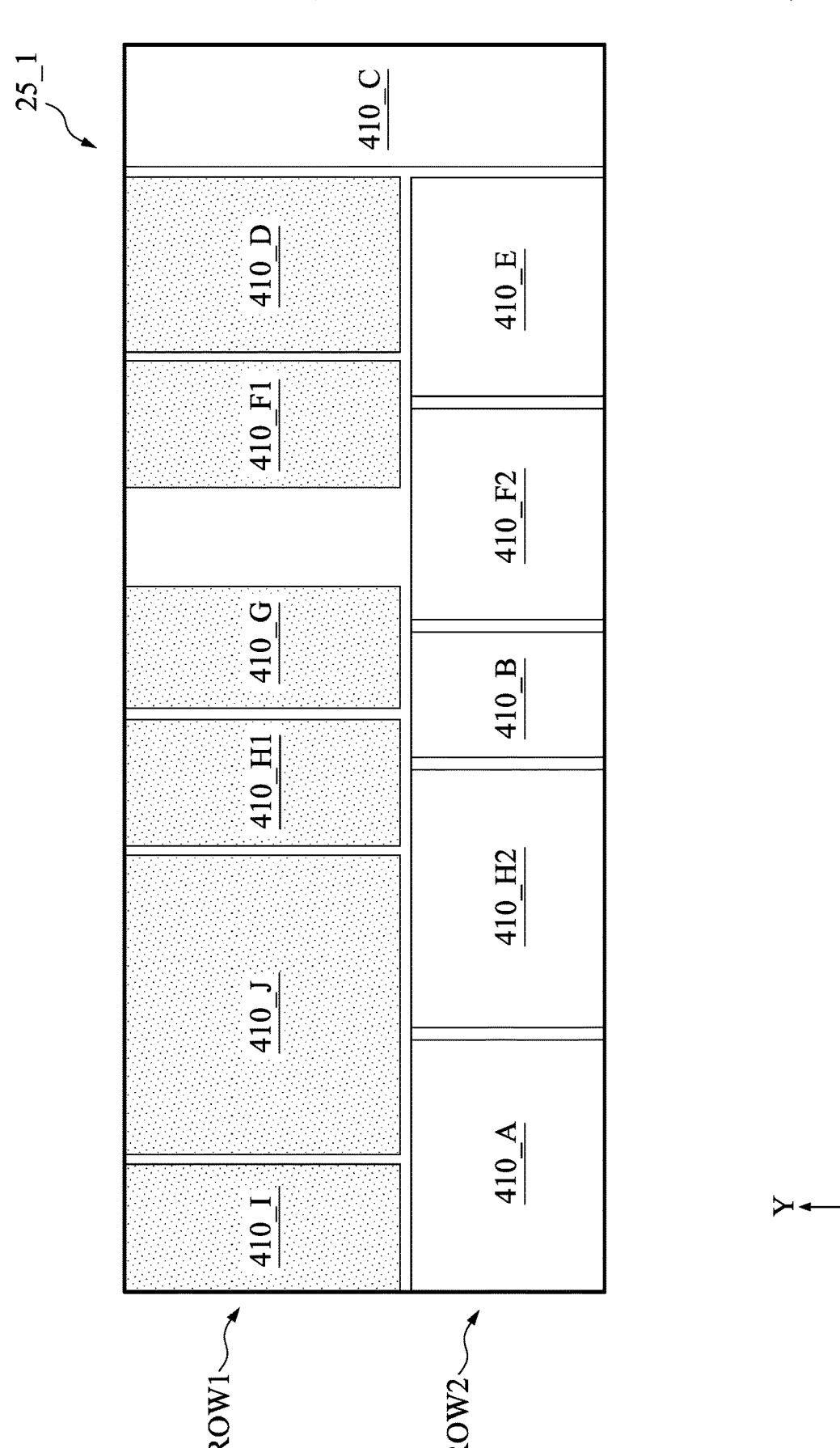
FIG. 8A is a floorplan of a logic cell corresponding to the standard cell shown in FIG. 4B, in accordance with some embodiments of the present disclosure.
Figure 8B:
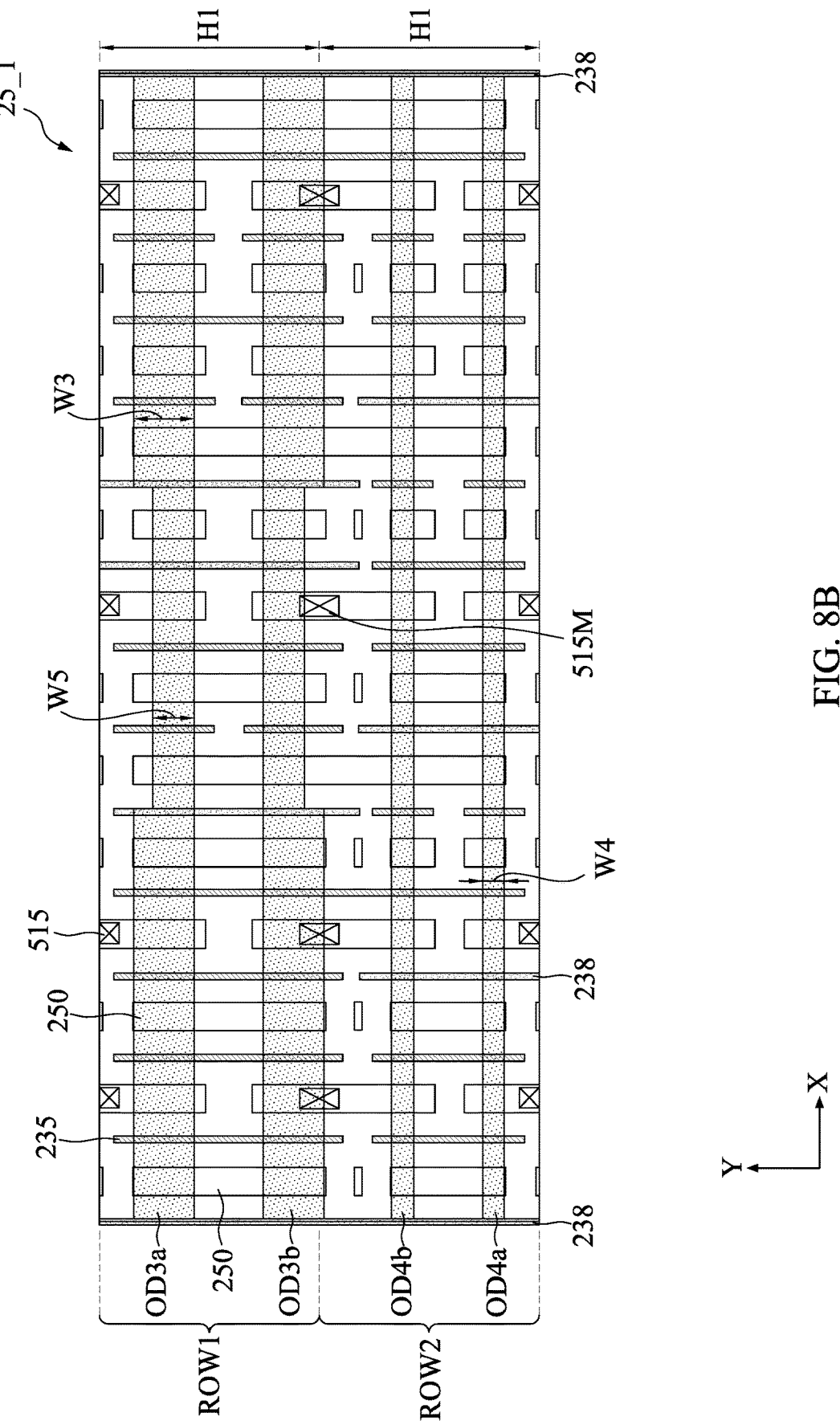
FIG. 8B and FIG. 8C are respective layouts of an FEOL/MEOL structure and a BEOL structure of the logic cell shown in FIG. 8A, in accordance with some embodiments of the present disclosure.
Figure 8C:
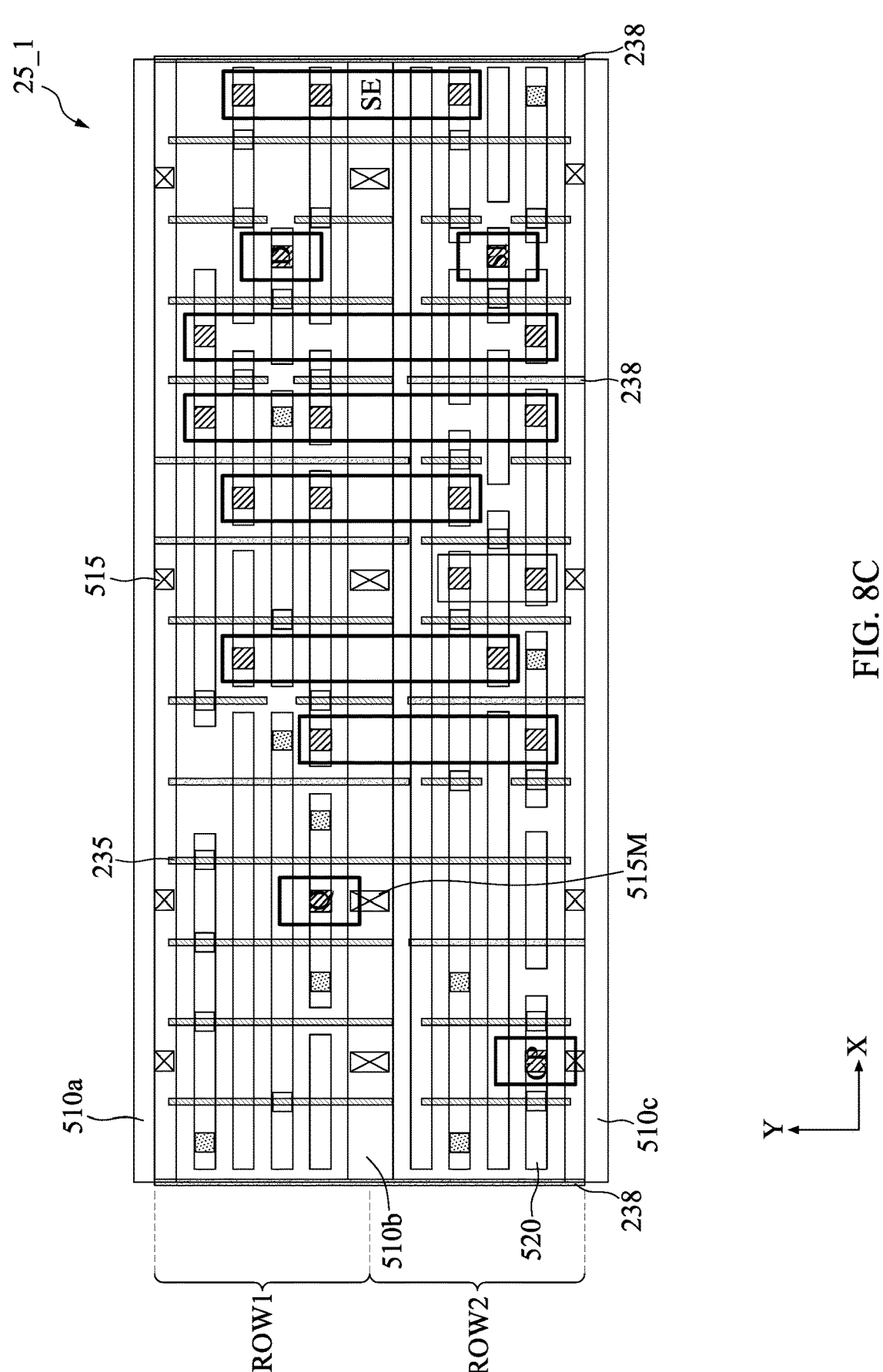

FIG. 8A is a floorplan of a first type of logic cell 25_1 corresponding to the standard cell 400 in FIG. 4B, in accordance with some embodiments of the present disclosure. FIG. 8B is a layout of the FEOL/MEOL structure of the logic cell 25_1 in FIG. 8A, and FIG. 8C is a layout of the BEOL structure of the logic cell 25_1 in FIG. 8A, in accordance with some embodiments of the present disclosure.

The embodiment of the logic cell 25_1 is obtained according to the operations S302, S304, S306, S310 and S318 of the layout method 300 in FIG. 3, and the floorplan with the wide and narrow active regions is generated in response to a determination that the number of transistors of the device units in the timing-critical group is within the predetermined range in the operation S306 of FIG. 3 and all source regions of the device units in the non-timing-critical group are vertically aligned to the sources regions of the device units in the timing-critical group in the operation S310 of FIG. 3.

Compared with the logic cell 20_1 of FIG. 7A, the device units 410_D, 410_F1, 410_G, 410_H1, 410_I and 410_J of the timing-critical group in the logic cell 25_1 are only arranged in the row ROW1 of the cell array. In the rows ROW1 and ROW2, the logic cell 25_1 is separated from other logic cells (not shown) by the isolation structures 238 on the left and right sides. Furthermore, in the logic cell 25_1, the active regions OD3a and OD3b in the row ROW1 are divided into multiple sub-regions with different widths (e.g., the widths W3 and W5) by the isolation structures 238. The width W3 is greater than the width W5, and the width W5 is greater than the width W4 of the active regions OD4a and OD4b, i.e., W3>W5>W4. In some embodiments, the width W5 is equal to the width W1.

The source regions in the rows ROW1 and ROW2 are aligned along the Y direction. The vias 515M overlap the active region OD3b, and the common power line 510b between the rows ROW1 and ROW2 overlaps the active region OD3b. Compared with the logic cell 20_1 of FIGS. 7A through 7C, the device units of the timing-critical group are arranged in the row ROW1 with the wide active regions OD3a and OD3b, thereby increasing the speed of the standard cell 400 without requiring additional area.

In some embodiments, the logic cell 20_1 of FIGS. 7A through 7C and the logic cell 25_1 of FIGS. 8A through 8C are arranged in the same rows, e.g., the rows ROW1 and ROW2. Furthermore, the active regions OD1a and OD2a of the logic cell 20_1 and the active regions OD3a and OD4a of the logic cell 25_1 have the same conductivity. Similarly, the active regions OD1b and OD2b of the logic cell 20_1 and the active regions OD3b and OD4b of the logic cell 25_1 have the same conductivity.

Figure 9A:
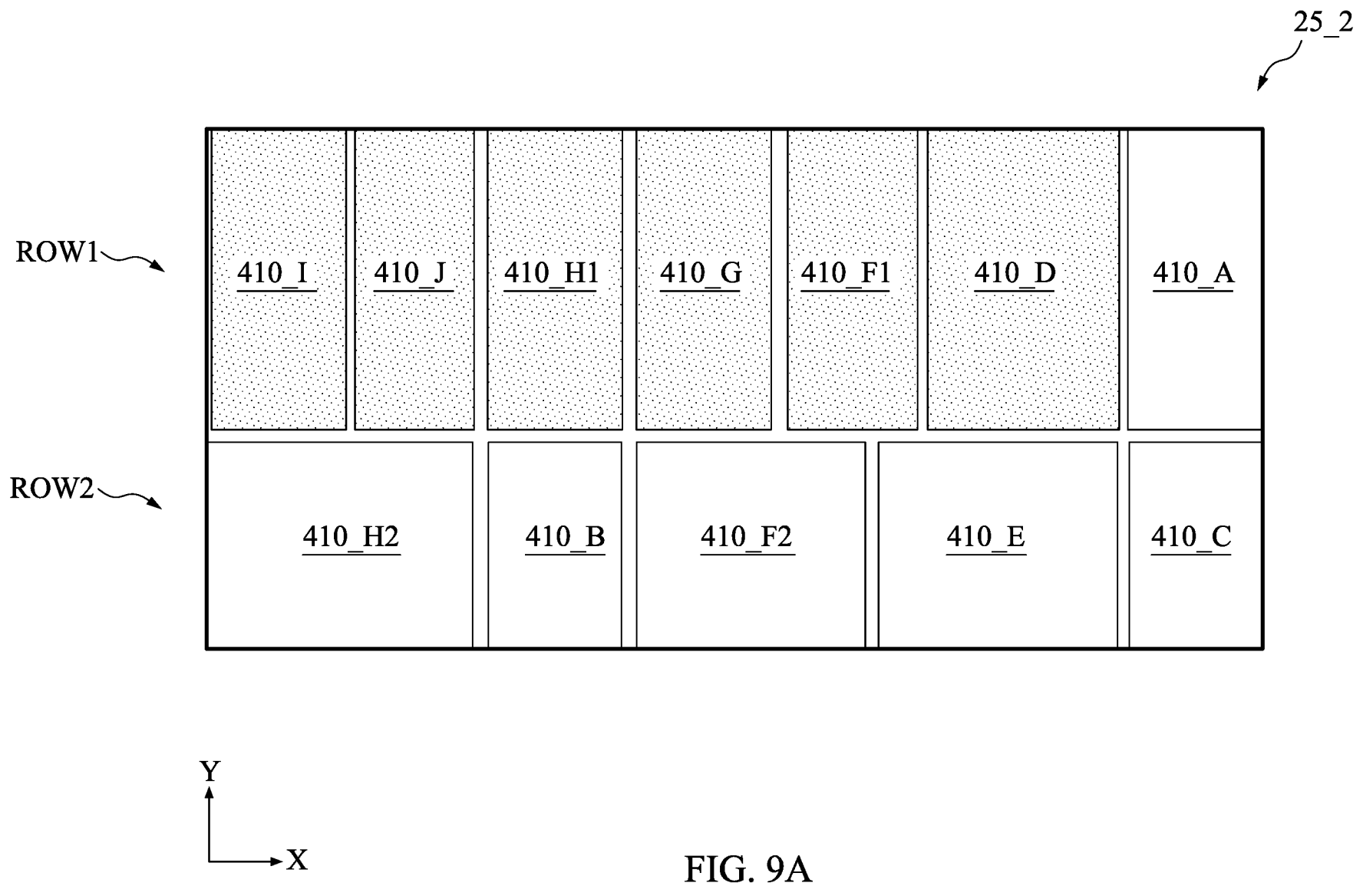
Figure 9B:
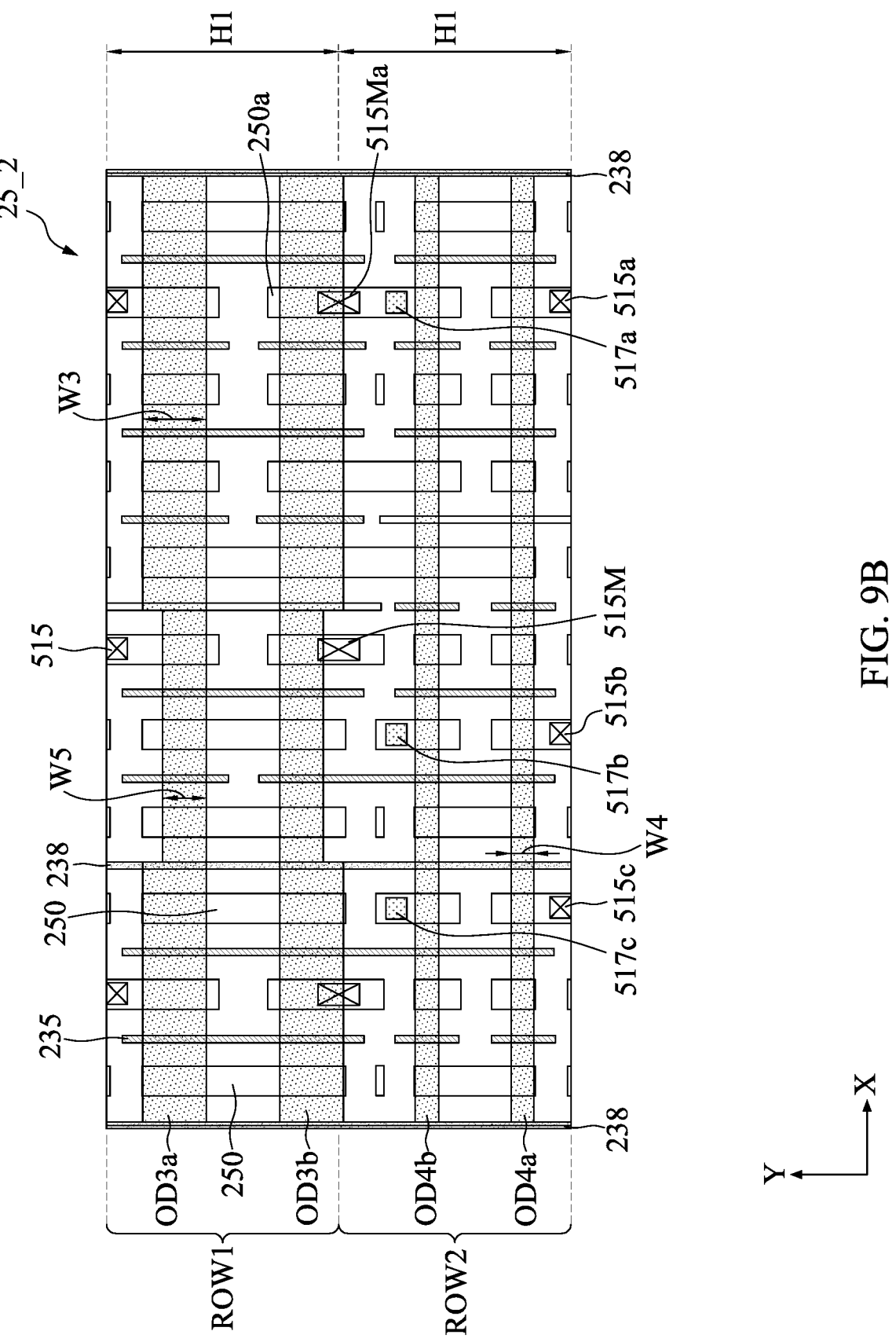
FIG. 9B and FIG. 9C are respective layouts of an FEOL/MEOL structure and a BEOL structure of the logic cell shown in FIG. 9A, in accordance with some embodiments of the present disclosure.
Figure 9C:
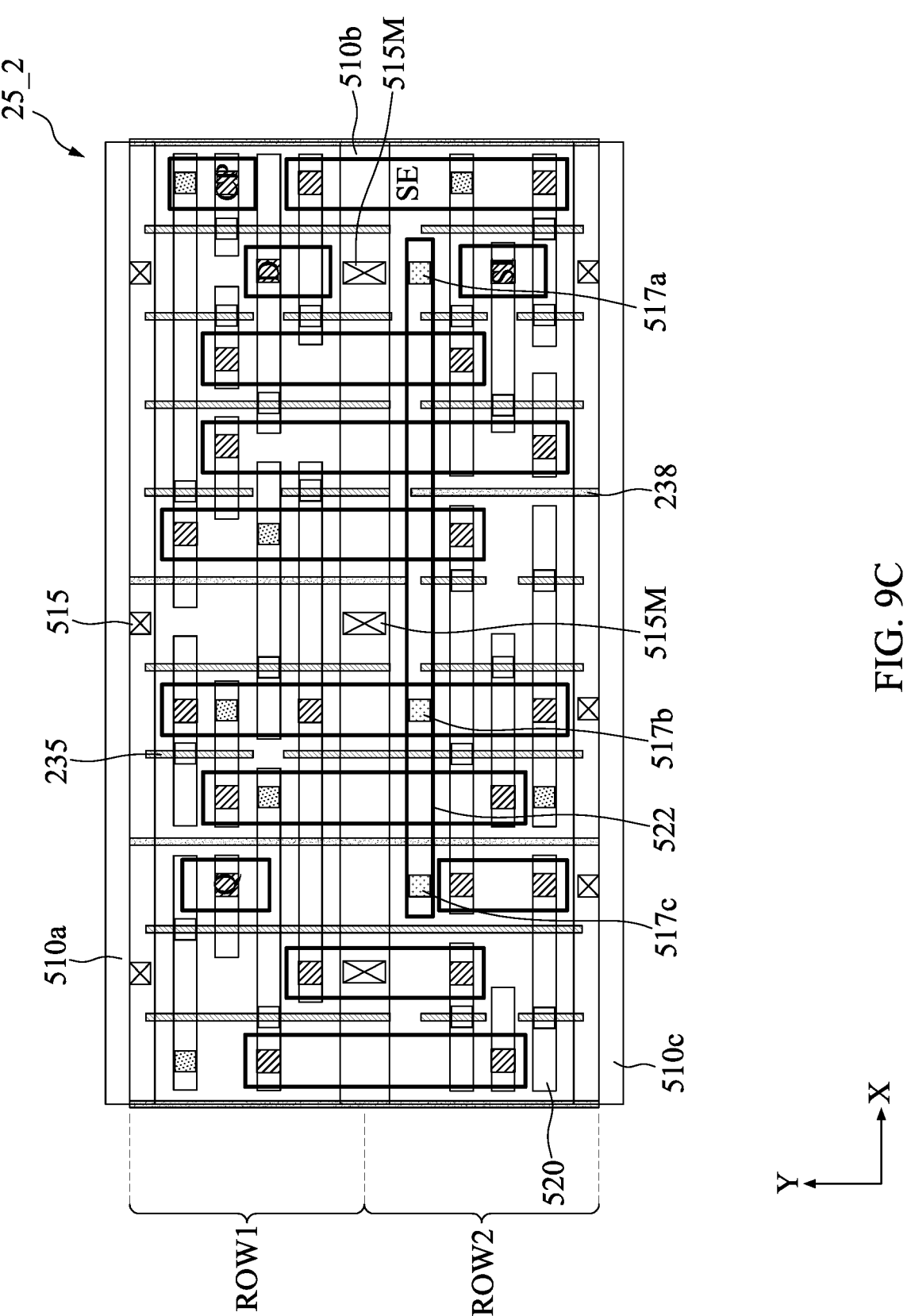

FIG. 9A is a floorplan of a second type of logic cell 25_2 corresponding to the standard cell 400 in FIG. 4B, in accordance with some embodiments of the present disclosure. FIG. 9B is a layout of the FEOL/MEOL structure of the logic cell 25_2 in FIG. 9A, and FIG. 9C is a layout of the BEOL structure of the logic cell 25_2 of FIG. 9A, in accordance with some embodiments of the present disclosure.

The embodiment of the logic cell 25_2 is obtained according to the operations S302, S304, S306, S310, S312, S314, S316 and S318 of the layout method 300 in FIG. 3, and the floorplan with the wide and narrow active regions is generated in response to a determination that the number of transistors of the device units in the timing-critical group is within the predetermined range in the operation S306 of FIG. 3 and not all of the source regions of the device units in the non-timing-critical group are aligned to the sources regions of the device units in the timing-critical group in the operation S310 of FIG. 3. Furthermore, it is further determined that the unused metal line is present in the operation S312 of FIG. 3 and at least one source region of the device units in the non-timing-critical group is vertically aligned with the sources regions of the device units in the timing-critical group in the operation S314 of FIG. 3.

Similar to the logic cell 25_1 of FIG. 8A, the device units 410_D, 410_F1, 410_G, 410_H1, 410_I and 410_J of the timing-critical group in the logic cell 25_2 are only arranged in the row ROW1 of the cell array, thereby increasing the speed of the standard cell 400 without requiring additional area. Furthermore, compared with the logic cell 25_1 of FIG. 8A, the source regions in the rows ROW2 are not completely aligned to the sources regions in the rows ROW1 since some of the vias 515 in the row ROW2 are not aligned to the vias 515 in the row ROW1 and the vias 515M. For example, in the row ROW2, only the via 515a is aligned to the vias 515 in the row ROW1 and the via 515Ma, while the vias 515b and 515c are not aligned. Furthermore, the via 515Ma and the via 517a are formed over and connected the contact feature 250a.

In the logic cell 25_2, the non-aligned vias 515b and 515c are configured to electrically connect the power line 510c to the non-aligned source regions in the active region OD4b through the metal line 522, the vias 517a, 517b and 517c and the corresponding contact features 250. The metal line 522 is electrically connected to the contact feature 250a through the via 517a, so that the non-aligned source regions in the active region OD4b can be electrically connected to the power line 510b. As described above, the metal line 522 is the unused metal line 520 closer the power line 510b, and the metal lines 520 and the power lines 510a through 510c are formed in the same metal layer.

Figure 10A:
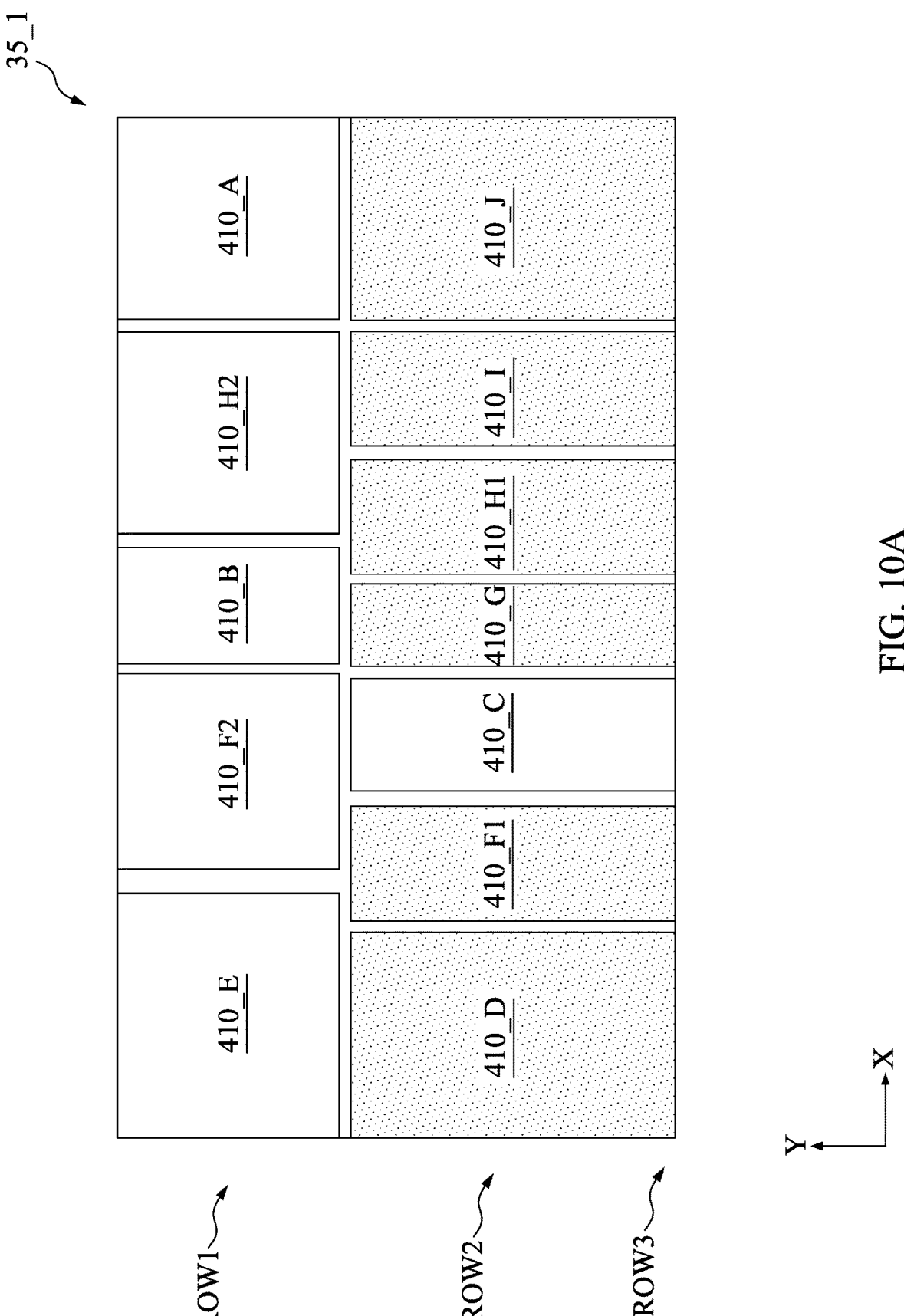
FIG. 10A is a floorplan of a logic cell corresponding to the standard cell shown in FIG. 4B, in accordance with some embodiments of the present disclosure.
Figure 10B:
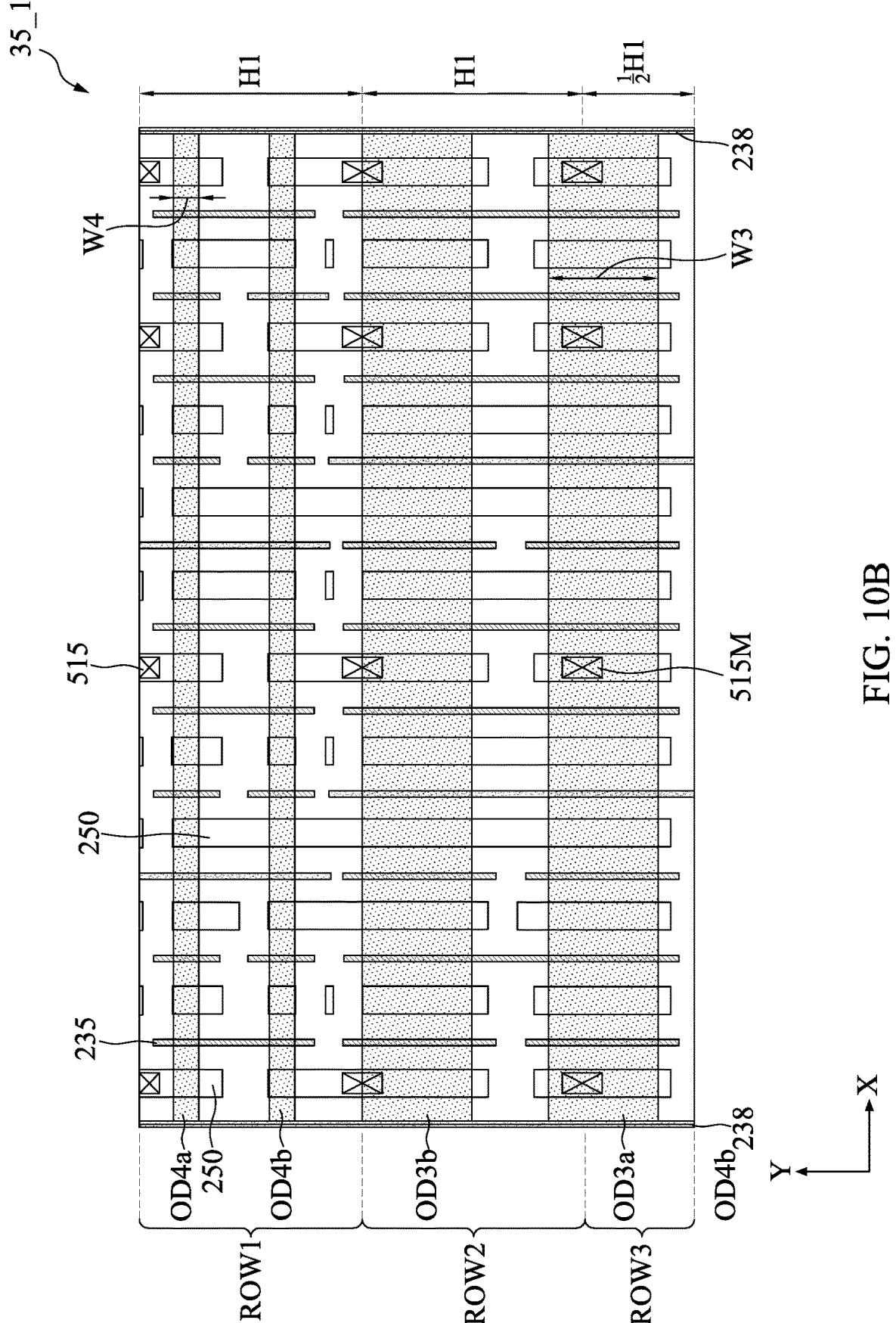
FIG. 10B and FIG. 10C are respective layouts of an FEOL/MEOL structure and a BEOL structure of the logic cell shown in FIG. 10A, in accordance with some embodiments of the present disclosure.
Figure 10C:
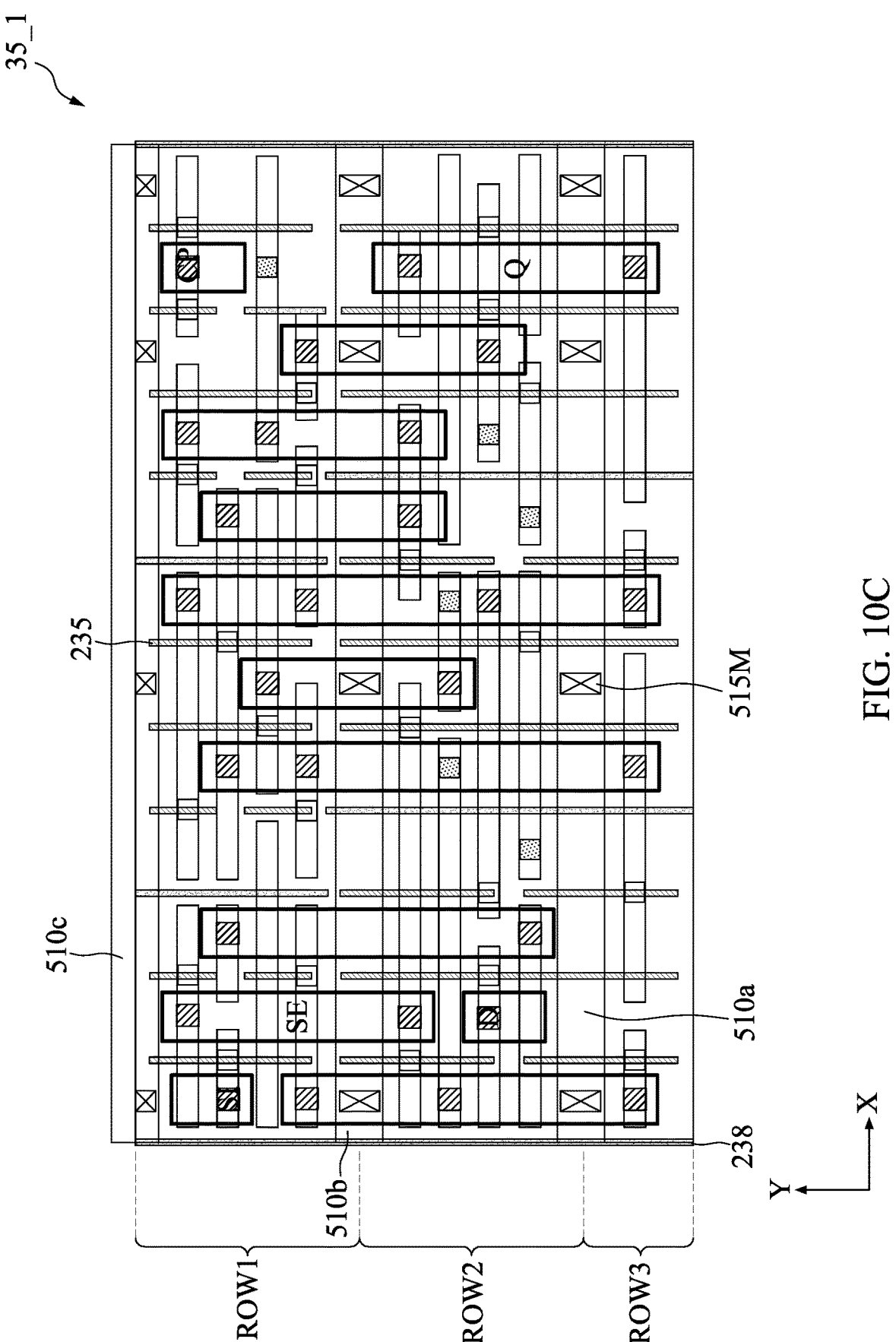

FIG. 10A is a floorplan of the logic cell 35_1 corresponding to the standard cell 400 in FIG. 4B, in accordance with some embodiments of the present disclosure. FIG. 10B is a layout of the FEOL/MEOL structure of the logic cell 35_1 of FIG. 10A and FIG. 10C is a layout of the BEOL structure of the logic cell 35_1 of FIG. 10A, in accordance with some embodiments of the present disclosure. The logic cell 35_1 is a 2.5×-height logic cell, and arranged in the rows ROW1 and ROW2, and the upper half of the row ROW3 of the cell array.

The embodiment of the logic cell 35_1 is obtained according to the operations S302, S304, S306, S310 and S318 of the layout method 300 in FIG. 3, and the floorplan with the wide and narrow active regions is generated in response to a determination that the number of transistors of the device units in the timing-critical group is within the predetermined range in the operation S306 of FIG. 3 and all source regions of the device units in the non-timing-critical group are vertically aligned to the sources regions of the device units in the timing-critical group in the operation S310 of FIG. 3.

In the logic cell 35_1, the device units 410_D, 410_F1, 410_G, 410_H1, 410_I and 410_J of the timing-critical group are arranged in the rows ROW2 and ROW3. Furthermore, the active region OD3b is arranged in the row ROW2, the active regions OD4a and OD4b are arranged in the row ROW1, and the active region OD3a is arranged between the rows ROW2 and ROW3. In some embodiments, the width W3 is equal to about 56 nm and the width W4 is equal to about 13 nm, and the ratio of widths W3 and W4 exceeds about 4.

The source regions in the rows ROW1 through ROW3 are aligned along the Y direction. A portion of the vias 515M overlaps the active region OD3b and the remaining portion of the vias 515M overlaps the active region OD3a. The common power line 510b between the rows ROW1 and ROW2 overlaps the active region OD3b, and the power line 510c overlaps the active region OD3a. Compared with the logic cell having the original placement (i.e., the original active regions), the device units of the timing-critical group are arranged in the rows ROW2 and ROW3 with the wide active regions OD3a and OD3b, thereby increasing the speed of the standard cell 400 without requiring additional area.

Figure 11:
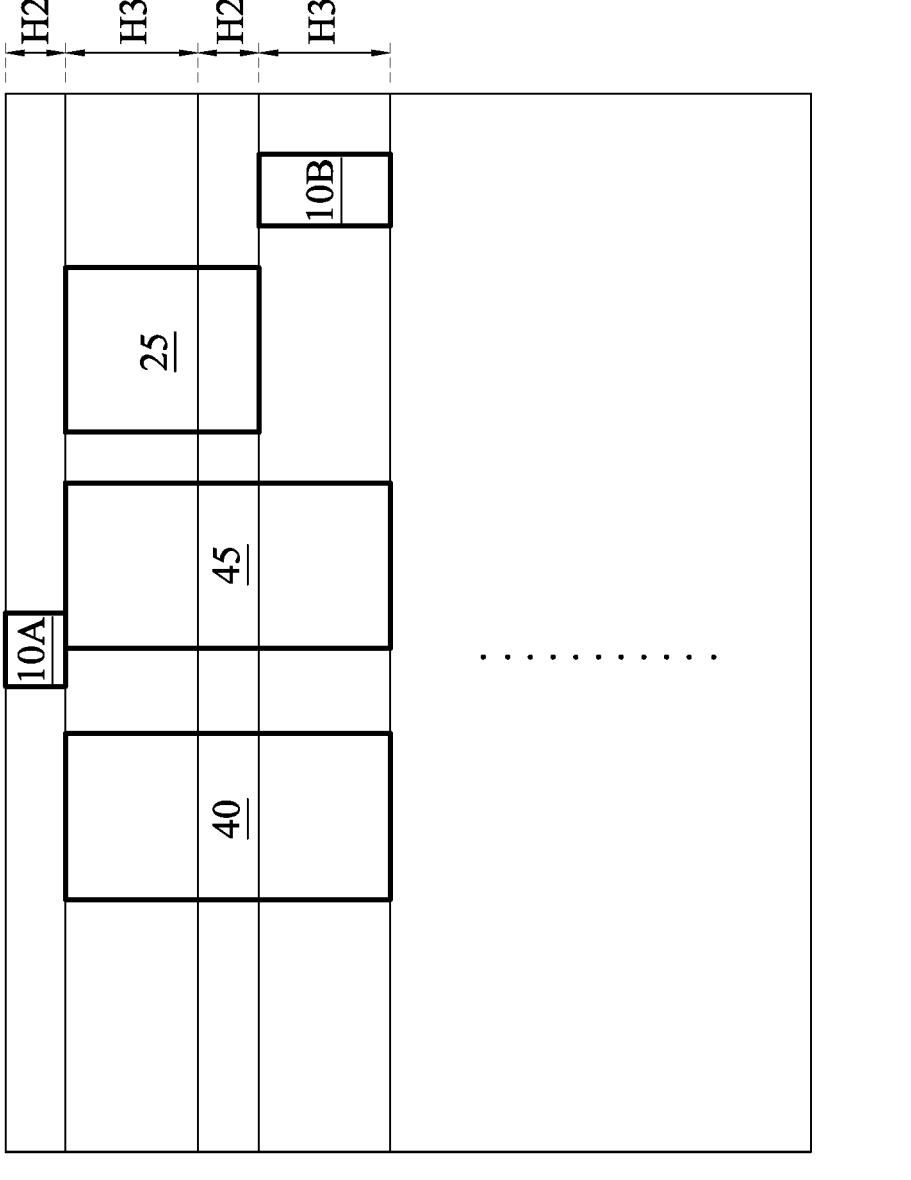
FIG. 11 is a simplified diagram of a cell array of an IC, in accordance with some embodiments of the disclosure.

FIG. 11 is a simplified diagram of a cell array 600 of an IC, in accordance with some embodiments of the disclosure. The cell array 600 includes multiple logic cells arranged in multiple rows. In the cell array 600, the rows with the short height H2 and the rows with the tall height H3 are staggered. The logic cells include the logic cells 10A, 10B, 25, 40 and 45 with various cell heights. The logic cell 10A is a single-height logic cell having a cell height H2, and the logic cell 10B is a single-height logic cell having a height H3.

The logic cells 25, 40 and 45 are multi-height logic cells. As described above, the logic cell 25 is a double-height logic cell having a cell height that is equal to the sum of the tall height H3 and the short height H2, and the timing-critical device units are arranged in the row with the tall height H3 and the non-timing-critical device units are arranged in the row with the short height H2. The logic cells 40 and 45 are the triple-height logic cells having a cell height that is equal to the sum of the short height H2 and twice the tall height H3. In some embodiments, the logic cells 40 and 45 have different active region configurations. For example, the logic cell 40 has the original active regions generated in the operation S308 in FIG. 3 and the logic cell 45 has the modified active regions generated in the operation S318 in FIG. 3. In other word, the logic cell 40 has the original placement design obtained from a cell library, and the logic cell 45 has a specific placement design different from the original placement design and generated according to the layout method 300 of FIG. 3.

Figure 12A:
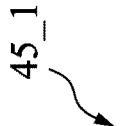
FIG. 12A is a floorplan of a logic cell corresponding to the standard cell shown in FIG. 4B, in accordance with some embodiments of the present disclosure.
Figure 12A:
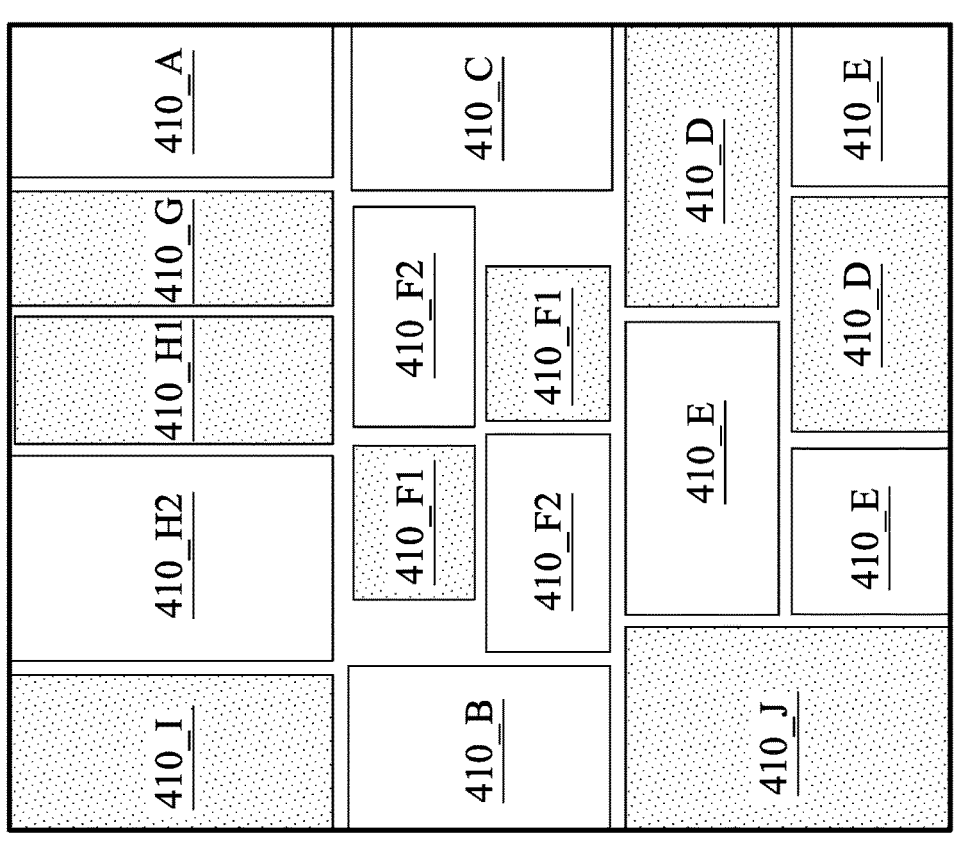
Figure 12B:
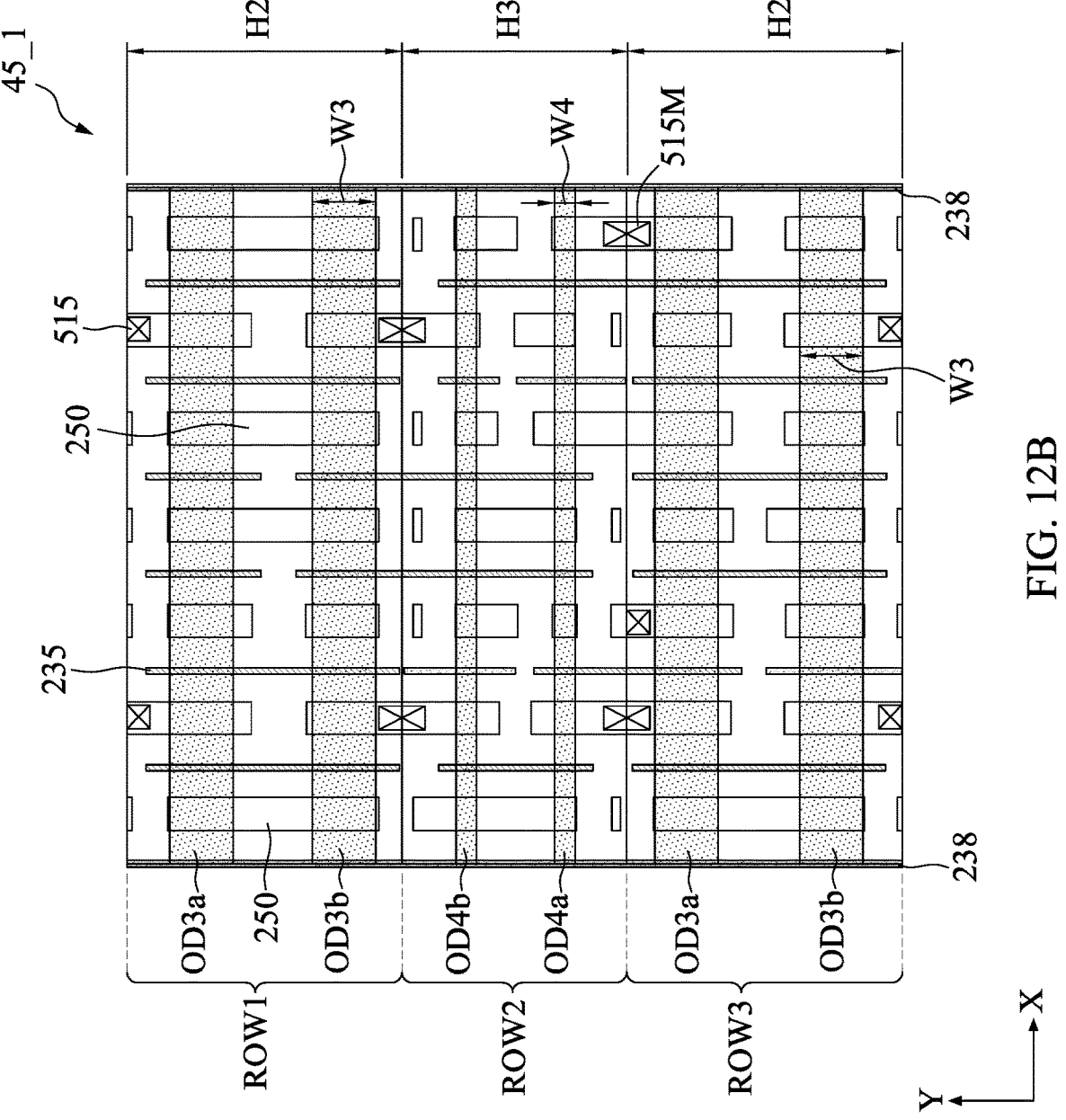
FIG. 12B and FIG. 12C are respective layouts of an FEOL/MEOL structure and a BEOL structure of the logic cell shown in FIG. 12A, in accordance with some embodiments of the present disclosure.
Figure 12C:
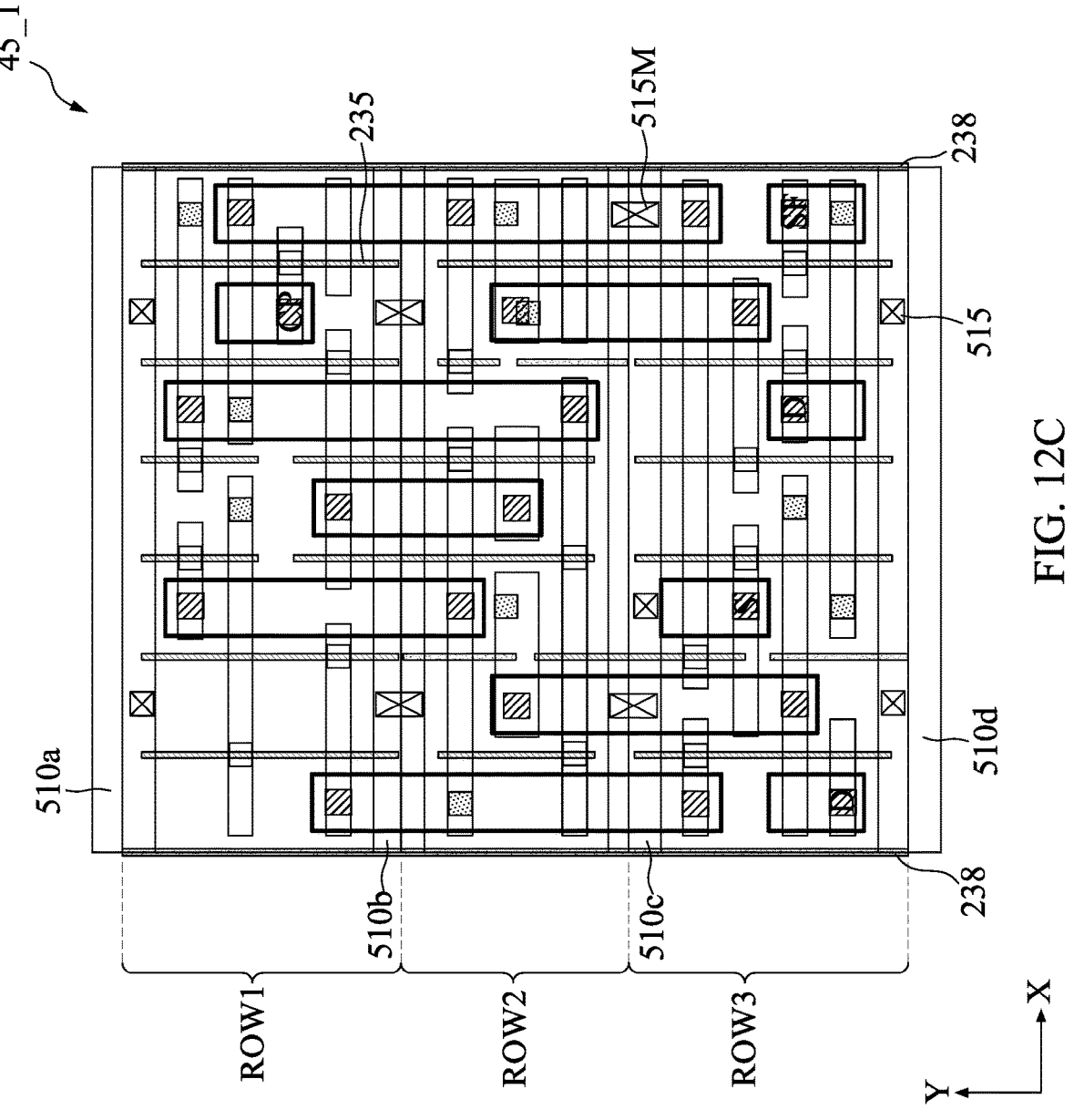

FIG. 12A is a floorplan of the logic cell 45_1 corresponding to the standard cell 400 in FIG. 4B, in accordance with some embodiments of the present disclosure. FIG. 12B is a layout of the FEOL/MEOL structure of the logic cell 45_1 of FIG. 12A and FIG. 12C is a layout of the BEOL structure of the logic cell 45_1 of FIG. 12A, in accordance with some embodiments of the present disclosure. The logic cell 45_1 is a triple-height logic cell, and arranged in the rows ROW1 through ROW3 of the cell array.

In the logic cell 45_1, the device units 410_D, 410_F1, 410_G, 410_H1, 410_I and 410_J of the timing-critical group are not arranged in the rows ROW1 through ROW3. The active regions OD3a and OD3b are arranged in the rows ROW1 and ROW3, and the active regions OD4a and OD4b are arranged in the row ROW2. In some embodiments, the width W3 is equal to 27.5 nm and the width W4 is equal to about 8 nm, and the ratio of widths W3 and W4 exceeds about 3.

In some embodiments, the common power line 510b between the rows ROW1 and ROW2 overlaps the upper active region OD3b, and the common power line 510c between the rows ROW2 and ROW3 overlaps the lower active region OD3a. Compared with the logic cell having the original placement design (i.e., the original active regions, not shown), the device units of the timing-critical group are mostly arranged in the rows ROW1 and ROW3 with the wide active regions OD3a and OD3b, thereby increasing the speed of the standard cell 400 without requiring additional area.

Figure 13A:
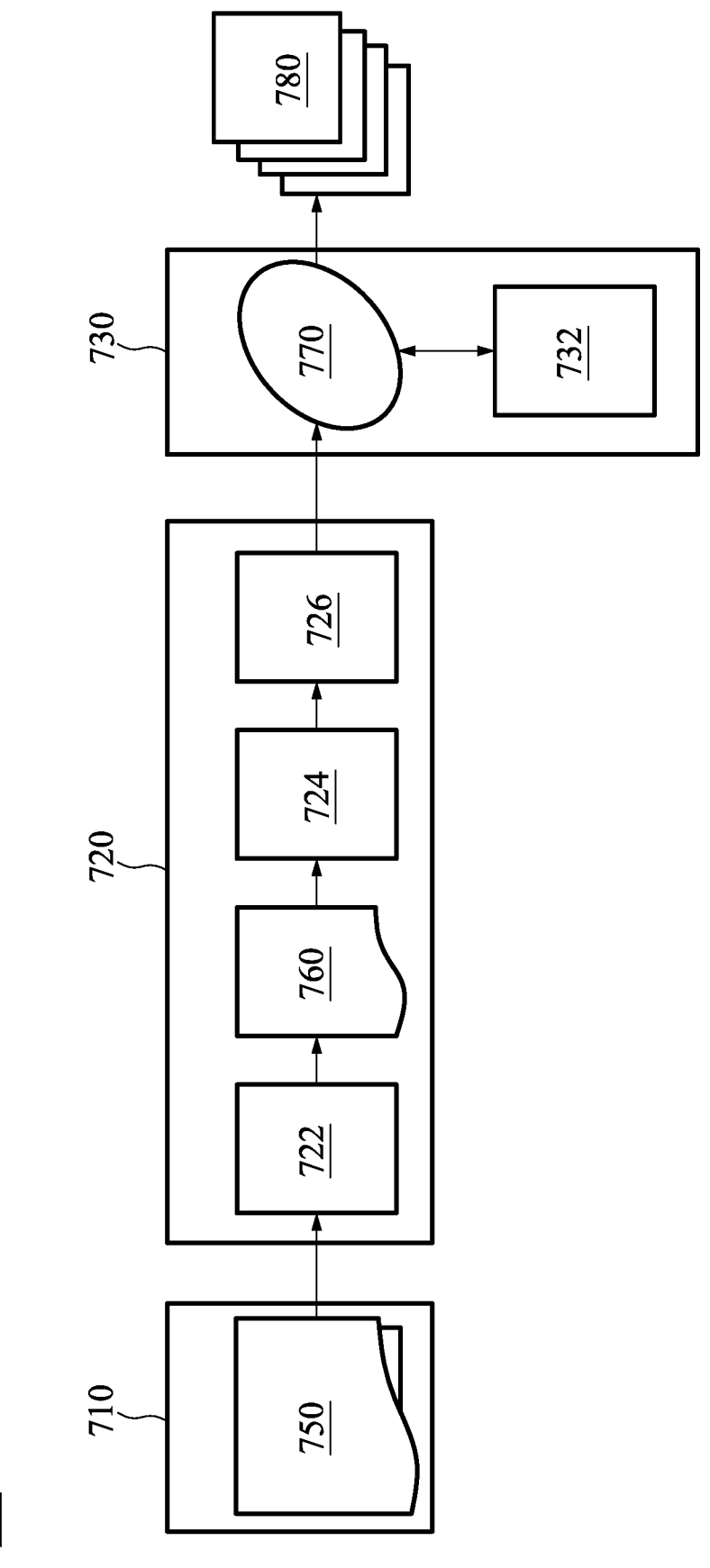
FIG. 13A is a schematic diagram showing an IC manufacturing system, in accordance with some embodiments of the present disclosure.

FIG. 13A is a schematic diagram showing an integrated circuit (IC) manufacturing system 700, in accordance with some embodiments of the present disclosure. The IC manufacturing system 700 is configured to manufacture an IC device 780 through a plurality of entities, such as a design subsystem 710, a mask subsystem 720, and a fabrication subsystem 730. The entities in the IC manufacturing system 700 may be linked by a communication channel, e.g., a wired or wireless channel, and interact with one another through a network, e.g., an intranet or the internet. In some embodiments, the design subsystem 710, the mask subsystem 720 and the fabrication subsystem 730 are implemented in a single entity, or are operated by independent parties.

The design subsystem 710 may be provided by a design house or a layout design provider, and generates a design layout 750 in a design phase for the IC devices 780 to be fabricated. The design subsystem 710 may perform the layout methods discussed in the present disclosure to generate the design layout 750 including one or more cell arrays, e.g., the design layouts shown with reference to the figures of the present disclosure. In some embodiments, the design subsystem 710 is configured to use a circuit design procedure to generate the design layout 750. The design subsystem 710 may include further one or more steps, such as logic design, physical design, pre-layout simulation, placement and routing, timing analysis, parameter extraction, design rule check and post-layout simulation, to generate the design layout 750. The design layout 750 may be converted from description texts into their visual equivalents to show a physical layout of the depicted patterns, such as the dimensions, shapes and locations thereof. In an embodiment, the design layout 750 can be expressed in a suitable file format such as GDSII, DFII, OASIS, or the like.

The mask subsystem 720 receives the design layout 750 from the design subsystem 710 and manufactures one or more masks (photomask, lithography masks or reticles) according to the design layout 750. In some embodiments, the mask subsystem 720 includes a mask data preparation block 722, a mask fabrication block 724 and a mask inspection block 726. The mask data preparation block 722 modifies the design layout 750 so that a revised design layout 760 can allow a mask writer to transfer the design layout 750 to a writer-readable format.

The mask fabrication block 724 is configured to fabricate the one or more masks by preparing a substrate based on the design layout 760 provided by the mask data preparation block 722. A mask substrate is exposed to a radiation beam based on the pattern of the revised design layout 760 in a writing operation, which may be followed by an etching operation to leave behind the patterns corresponding to the design layout 760. In some embodiments, the mask fabrication block 724 includes a checking procedure to ensure that the layout data 760 complies with requirements of a mask writer and/or a mask manufacturer to generate the mask as desired. An electron-beam (e-beam), multiple e-beams, an ion beam, a laser beam or other suitable writer source may be used to transfer the patterns.

After the one or more masks are fabricated, the mask inspection block 726 inspects the fabricated masks to determine if any defects, such as full-height and non-full-height defects, exist in the fabricated mask. If any defects are detected, the mask may be cleaned or the design layout in the mask may be modified.

The fabrication subsystem 730 is an IC manufacturing entity that includes multiple manufacturing facilities or tools for the fabrication of a variety of the IC devices 780. The fabrication subsystem 730 uses the mask fabricated by the mask subsystem 720 to fabricate a wafer 770 having the IC devices 780 thereon. The wafer 770 includes a semiconductor substrate and optionally various layers formed thereon. The operations provided by the manufacturing facilities or tools may include, but are not limited to, photolithography, deposition, sputtering, etching, diffusion, ion implantation and annealing. In some embodiments, test structures may be formed on the wafer 770 to generate test data indicative of the quality of the fabricated wafer 770. In some embodiments, the fabrication subsystem 730 includes a wafer testing block 732 configured to ensure that the wafer 770 conforms to physical manufacturing specifications and mechanical and/or electrical performance specifications. After the wafer 770 passes the testing procedure performed by the wafer testing block 732, the wafer 770 may be diced (or sliced) along the scribe line regions to form separate IC devices 780. The dicing process can be accomplished by scribing and breaking, by mechanical sawing (e.g., with a dicing saw) or by laser cutting.

Figure 13B:
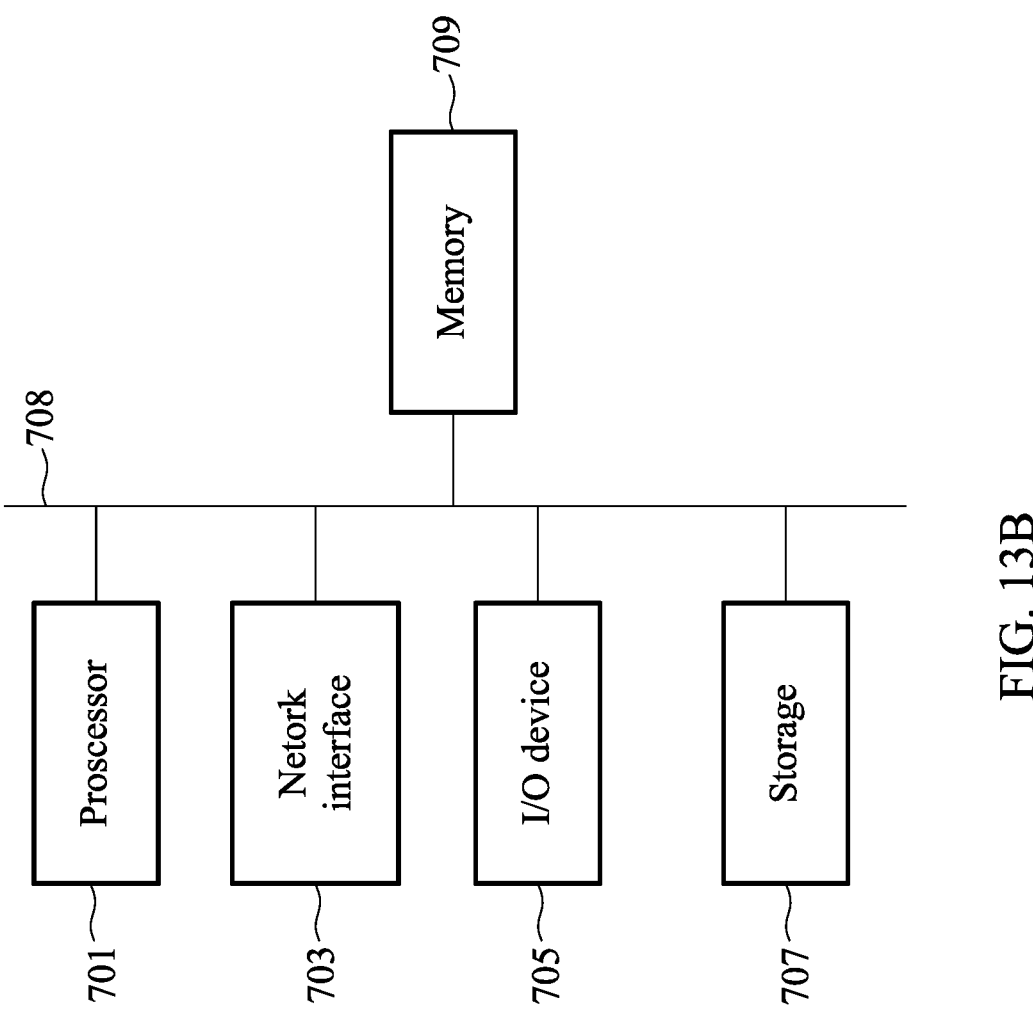
FIG. 13B is a schematic diagram of the design system for implementing or storing the design layouts discussed above, in accordance with some embodiments of the present disclosure.

FIG. 13B is a schematic diagram of the design system (e.g., the design subsystem 710 of FIG. 13A) for implementing or storing the design layouts discussed above, in accordance with some embodiments of the present disclosure. The design system includes a processor 701, a network interface 703, an input and output (I/O) device 705, a storage device 707, a memory 709, and a bus 708. The processor 701 is configured to communicate with the network interface 703, the I/O device 705, the storage device 707, and the memory 709 through the bus 708.

The processor 701 is configured to execute program instructions that include a tool configured to generate the design layouts as described and illustrated with reference to figures of the present disclosure.

The network interface 703 is configured to access program instructions and data accessed by the program instructions stored remotely through a network (not shown).

The I/O device 705 includes an input device and an output device configured for enabling user interaction with the design system 710. In some embodiments, the input device includes, for example, a keyboard, a mouse, and other devices. Moreover, the output device includes, for example, a display, a printer, and other devices.

The storage device 707 is configured for storing the design layouts, one or more cell libraries including the configurations and settings of the standard cells as discussed previously, program instructions and data accessed by the program instructions. In some embodiments, the storage device 707 includes a non-transitory computer-readable storage medium, for example, a magnetic disk and an optical disk.

The memory 709 is configured to store program instructions to be executed by the processor 701 and data accessed by the program instructions. In some embodiments, the memory 709 includes any combination of a random access memory (RAM), some other volatile storage device, a read-only memory (ROM), and some other non-volatile storage device.

According to some embodiments, a layout method for an integrated circuit is provided. The method includes the following operations. Design data of a standard cell is received, and the standard cell includes a plurality of device units. A timing analysis is performed based on the design data to classify the device units into a timing-critical group and a non-timing-critical group, and the timing-critical group includes the device units in a timing-critical path and the non-timing-critical group includes the device units in a non-timing-critical path. First floorplan of the standard cell is generated in a layout, and a plurality of first sources regions of a plurality of first transistors in the device units of the non-timing-critical group are aligned with a plurality of second sources regions of a plurality of second transistors in the device units of the timing-critical group in a first direction in the layout in response to a number of the second transistors in the device units of the timing-critical group being determined as within a predetermined range. In the first floorplan, the device units of the timing-critical group are arranged in a first row of a cell array, and the device units of the non-critical group are arranged in a second row of the cell array. The first and second rows of the cell array share a common power line extending in a second direction that is perpendicular to the first direction. A plurality of first active regions of the first row are wider than a plurality of second active regions of the second row, and one of the first active regions overlaps the common power line.

According to some embodiments, a layout method for an integrated circuit is provided. The method includes the following operations. A first design data of a first standard cell is received, and the first standard cell includes a plurality of first device units. A second design data of a second standard cell is received, and the second standard cell includes a plurality of second device units. A timing analysis is performed on the first design data to classify the first device units into a timing-critical group and a non-timing-critical group. The timing-critical group includes a first subset of the first device units in a timing-critical path and the non-timing-critical group includes a second subset of the first device units in a non-timing-critical path. A plurality of first sources regions in the first device units of the non-timing-critical group are aligned with a plurality of second sources regions in the first device units of the timing-critical group to thereby generate a first floorplan of the first standard cell in a layout. In the first floorplan, the first subset of the first device units is arranged in a first row of a cell array, and the second subset of the first device units is arranged in a second row of the cell array. The second device units are arranged in the first and second rows of the cell array to generate a second floorplan of the second standard cell. The first and second rows of the cell array share a common power line extending in a second direction that is perpendicular to the first direction. In the first row, a first active region of the first device units is wider than a second active region of the second device units, and the first active region overlapping the common power line and the second active region non-overlapping the common power line have the same conductivity.

According to some embodiments, a semiconductor structure is provided. The semiconductor structure includes a plurality of standard cells arranged in a plurality of rows of a cell array. One of the standard cells includes a plurality of device units, and the device units are divided into a timing-critical group and a non-timing-critical group. The timing-critical group includes the device units in a timing-critical path and the non-timing-critical group includes the device units in a non-timing-critical path. The device units of the timing-critical group are arranged in a first row of the cell array and the device units of the non-timing-critical group are arranged in a second row of the cell array, and the first and second rows of the cell array share a common power line. A plurality of first active regions of the first row are wider than a plurality of second active regions of the second row, and one of the first active regions overlaps the common power line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A layout method for an integrated circuit, comprising:
   receiving design data of a standard cell comprising a plurality of device units;
   performing a timing analysis based on the design data to classify the device units into a timing-critical group and a non-timing-critical group, wherein the timing-critical group comprises the device units in a timing-critical path and the non-timing-critical group comprises the device units in a non-timing-critical path; and generating first floorplan of the standard cell in a layout, the generating comprising aligning a plurality of first sources regions of a plurality of first transistors in the device units of the non-timing-critical group with a plurality of second sources regions of a plurality of second transistors in the device units of the timing-critical group in a first direction in the layout in response to a number of the second transistors in the device units of the timing-critical group being determined as within a predetermined range, wherein in the first floorplan, the device units of the timing-critical group are arranged in a first row of a cell array, and the device units of the non-timing-critical group are arranged in a second row of the cell array, wherein the first and second rows of the cell array share a common power line extending in a second direction that is perpendicular to the first direction, wherein a plurality of first active regions of the first row are wider than a plurality of second active regions of the second row, and one of the first active regions overlaps the common power line.

2. The layout method of claim 1, wherein the second source regions of the device units in the timing-critical group are connected to the common power line or a first power line through a plurality of first connecting features, and the first source regions of the device units in the non-timing-critical group are connected to the common power line or a second power line through a plurality of second connecting features.

3. The layout method of claim 2, wherein the first and second power lines are parallel to the common power line in a metal layer, and the common power line is disposed between the first and second power lines.

4. The layout method of claim 2, wherein all of the first and second connecting features are aligned in the first direction in the first floorplan, and the first connecting features connected to the common power line and the second connecting features connected to the common power line are merged into a plurality of third connecting features.

5. The layout method of claim 2, further comprising:
arranging a metal line to connect the second connecting features non-overlapping the common power line and the second power line when at least one of the first connecting features and at least one of the second connecting features are aligned in the first direction and overlap the common power line; and connecting the metal line to the common power line through a third connecting feature extending in the first direction, wherein the metal line is parallel to and adjacent to the common power line, and the metal line and the common power line are disposed in the same metal layer.

6. The layout method of claim 5, wherein the at least one of the first connecting features and the at least one of the second connecting features are disposed between the third connecting feature and the common power line.

7. The layout method of claim 1, further comprising:
arranging all of the device units in two adjacent rows of the cell array to generate a second floorplan of the standard cell when the number of the second transistors in the device units of the timing-critical group is not within the predetermined range, wherein a plurality of third active regions of the two adjacent rows have substantially equal widths.

8. The layout method of claim 1, wherein the standard cell is a latch or a flip flop, and each of the device units comprises an inverter, a transmission gate or at least two transistors with the same conductivity coupled in series.

9. A layout method for an integrated circuit, comprising:
receiving a first design data of a first standard cell comprising a plurality of first device units;

receiving a second design data of a second standard cell comprising a plurality of second device units;

performing a timing analysis on the first design data to classify the first device units into a timing-critical group and a non-timing-critical group, wherein the timing-critical group comprises a first subset of the first device units in a timing-critical path and the non-timing-critical group comprises a second subset of the first device units in a non-timing-critical path;

aligning a plurality of first sources regions in the first device units of the non-timing-critical group with a plurality of second sources regions in the first device units of the timing-critical group in a first direction to thereby generate a first floorplan of the first standard cell in a layout, wherein in the first floorplan, the first subset of the first device units is arranged in a first row of a cell array, and the second subset of the first device units is arranged in a second row of the cell array; and arranging the second device units in the first and second rows of the cell array to generate a second floorplan of the second standard cell, wherein the first and second rows of the cell array share a common power line extending in a second direction that is perpendicular to the first direction, wherein in the first row, a first active region of the first device units is wider than a second active region of the second device units, and wherein the first active region overlapping the common power line and the second active region non-overlapping the common power line have the same conductivity.

10. The layout method of claim 9, wherein a third active region of the first device units in the second row is narrower than the first and second active regions in the first row, and the second active region in the first row and a fourth active region of the second device units in the second row have substantially equal widths.

11. The layout method of claim 9, wherein the second source regions of the first device units in the timing-critical group are connected to the common power line or a first power line through a plurality of first connecting features, and the first source regions of the first device units in the non-timing-critical group are connected to the common power line or a second power line through a plurality of second connecting features.

12. The layout method of claim 11, wherein all of the first and second connecting features are aligned in the first direction in the first floorplan, and the first connecting features connected to the common power line and the second connecting features connected to the common power line are merged into a plurality of third connecting features.

13. The layout method of claim 11, further comprising:
arranging a metal line to connect the second connecting features non-overlapping the common power line and the second power line when at least one of the first connecting features and at least one of the second connecting features are aligned in the first direction and overlap the common power line; and connecting the metal line to the common power line through a third connecting feature extending in the first direction, wherein the metal line is parallel to and adjacent to the common power line, and the metal line and the common power line are disposed in the same metal layer.

14. The layout method of claim 13, wherein the at least one of the first connecting features and the at least one of the second connecting features are disposed between the third connecting feature and the common power line.

15. The layout method of claim 9, wherein each of the first and second standard cells is a latch or a flip flop, and each of the first and second device units comprises an inverter, a transmission gate or at least two transistors with the same conductivity in series.

16. A semiconductor structure, comprising:

a plurality of standard cells arranged in a plurality of rows of a cell array, wherein one of the standard cells comprises a plurality of device units, and the device units are divided into a timing-critical group and a non-timing-critical group, wherein the timing-critical group comprises the device units in a timing-critical path and the non-timing-critical group comprises the device units in a non-timing-critical path, wherein the device units of the timing-critical group are arranged in a first row of the cell array and the device units of the non-timing-critical group are arranged in a second row of the cell array, and the first and second rows of the cell array share a common power line, wherein a plurality of first active regions of the first row are wider than a plurality of second active regions of the second row, and one of the first active regions overlaps the common power line.

17. The semiconductor structure of claim 16, wherein a plurality of first source regions of the device units in the timing-critical group are connected to the common power line or a first power line through a plurality of first connecting features, and a plurality of second source regions of the device units in the non-timing-critical group are connected to the common power line or a second power line through a plurality of second connecting features, wherein the first and second connecting features are arranged to align in a first direction that is perpendicular to the common power line.

18. The semiconductor structure of claim 17, wherein all of the first and second connecting features are aligned in the first direction, and the first connecting features connected to the common power line and the second connecting features connected to the common power line are merged into a plurality of third connecting features.

19. The semiconductor structure of claim 17, wherein at least one of the first connecting features and at least one of the second connecting features are aligned in the first direction and overlap the common power line, wherein the cell array comprises a metal line configured to connect the second connecting features non-overlapping the common power line and the second power line.

20. The semiconductor structure of claim 19, wherein the metal line is parallel to and adjacent to the common power line, and the metal line and the common power line are disposed in the same metal layer.

* * * * *